(12) United States Patent
Kitagawa et al.

(10) Patent No.: US 9,796,803 B2
(45) Date of Patent: Oct. 24, 2017

(54) UNDER LAYER FILM-FORMING COMPOSITION FOR IMPRINTS AND METHOD OF FORMING PATTERN

(71) Applicant: FUJIFILM Corporation, Minato-ku, Tokyo (JP)

(72) Inventors: Hirotaka Kitagawa, Haibara-gun (JP); Akiko Hattori, Haibara-gun (JP); Yuichiro Enomoto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 173 days.

(21) Appl. No.: 14/549,068

(22) Filed: Nov. 20, 2014

(65) Prior Publication Data

US 2015/0079804 A1 Mar. 19, 2015

Related U.S. Application Data

(63) Continuation of application No. PCT/JP2013/066899, filed on Jun. 13, 2013.

(30) Foreign Application Priority Data

Jun. 18, 2012 (JP) .................................. 2012-136896
Mar. 26, 2013 (JP) .................................. 2013-063881

(51) Int. Cl.
| | | |
|---|---|---|
| *C08F 220/32* | (2006.01) | |
| *G03F 7/00* | (2006.01) | |
| *B29C 59/00* | (2006.01) | |
| *C08F 220/18* | (2006.01) | |
| *C08F 220/28* | (2006.01) | |
| *H01L 21/02* | (2006.01) | |
| *B29K 33/00* | (2006.01) | |

(52) U.S. Cl.
CPC .......... *C08F 220/32* (2013.01); *B29C 59/005* (2013.01); *C08F 220/18* (2013.01); *C08F 220/28* (2013.01); *G03F 7/0002* (2013.01); *H01L 21/02356* (2013.01); *B29K 2033/12* (2013.01); *C08F 2220/281* (2013.01); *C08F 2220/325* (2013.01)

(58) Field of Classification Search
CPC .................................................... C08L 33/068
See application file for complete search history.

(56) References Cited

U.S. PATENT DOCUMENTS

| | | | |
|---|---|---|---|
| 4,618,557 A | 10/1986 | Dan et al. | |
| 4,716,094 A * | 12/1987 | Minonishi | G03F 7/027 430/281.1 |
| 8,623,161 B2 | 1/2014 | Kaida et al. | |
| 2011/0068504 A1 | 3/2011 | Tobise | |
| 2012/0168065 A1 | 7/2012 | Kaida et al. | |
| 2013/0020739 A1 | 1/2013 | Yamashita | |

FOREIGN PATENT DOCUMENTS

| | | | |
|---|---|---|---|
| JP | 61-043757 | A | 3/1986 |
| JP | 04 194943 | * | 7/1992 |
| JP | 2008-105414 | A | 5/2008 |
| JP | 2009-503139 | A | 1/2009 |
| JP | 2010-526426 | A | 7/2010 |
| JP | 2011-062978 | A | 3/2011 |
| KR | 10-2008-0028786 | A | 4/2008 |
| KR | 2009-0027169 | A | 3/2009 |
| WO | 2007/050133 | A2 | 5/2007 |
| WO | 2008/127835 | A1 | 10/2008 |
| WO | 2011/002042 | A1 | 1/2011 |
| WO | 2011/122545 | A1 | 6/2011 |
| WO | 2011/118797 | A1 | 9/2011 |

OTHER PUBLICATIONS

JP 04 194943 Abstract (1992).*
JP 04 194943 partial translatin (1992).*
Office Action dated Aug. 18, 2015 from the Japanese Patent Office in counterpart Japanese Application No. 2013-063881.
Office Action dated Mar. 20, 2016, issued by the Korean Intellectual Property Office in corresponding Korean Application No. 10-2014-7035329.
Office Action dated May 2, 2016 from Taiwanese Intellectual Property Office in counterpart Taiwanese Application No. 102121400.
International Preliminary Report on Patentability dated Dec. 31, 2014 from the International Bureau in counterpart Application No. PCT/JP2013/066899.
M. Colburn et al., "Step and Flash Imprint Lithography: A New Approach to High-Resolution Patterning", Part of the SPIE Conference on Emerging Lithographic Technologies III, Mar. 1999, pp. 379-389, SPIE vol. 3676, Santa Clara, California, US.
Stephen Y. Chou et al., "Imprint of sub-25 nm vias and trenches in polymers", App. Phys. Lett., Nov. 20, 1995, pp. 3114-3116, vol. 67, No. 21.
International Search Report for PCT/JP2013/066899 dated Sep. 10, 2013.
Written Opinion for PCT/JP2013/066899 dated Sep. 10, 2013.

* cited by examiner

*Primary Examiner* — Kuo-Liang Peng
(74) *Attorney, Agent, or Firm* — Sughrue Mion, PLLC

(57) ABSTRACT

An under layer film having excellent surface planarity is provided. In one aspect, the under layer film-forming composition for imprints includes a (meth)acrylic resin (A) containing an ethylenic unsaturated group (P) and a nonionic hydrophilic group (Q), and having a weight average molecular weight of 1,000 or larger; and a solvent (B), the resin (A) having an acid value of smaller than 1.0 mmol/g. In another aspect, the under layer film-forming composition for imprints includes a (meth)acrylic resin (A2) containing an ethylenic unsaturated group (P), and containing, as a nonionic hydrophilic group (Q), a cyclic substituent (Q2) having a carbonyl group in the cyclic structure thereof, with a weight average molecular weight of 1,000 or larger; and a solvent (B).

11 Claims, 1 Drawing Sheet

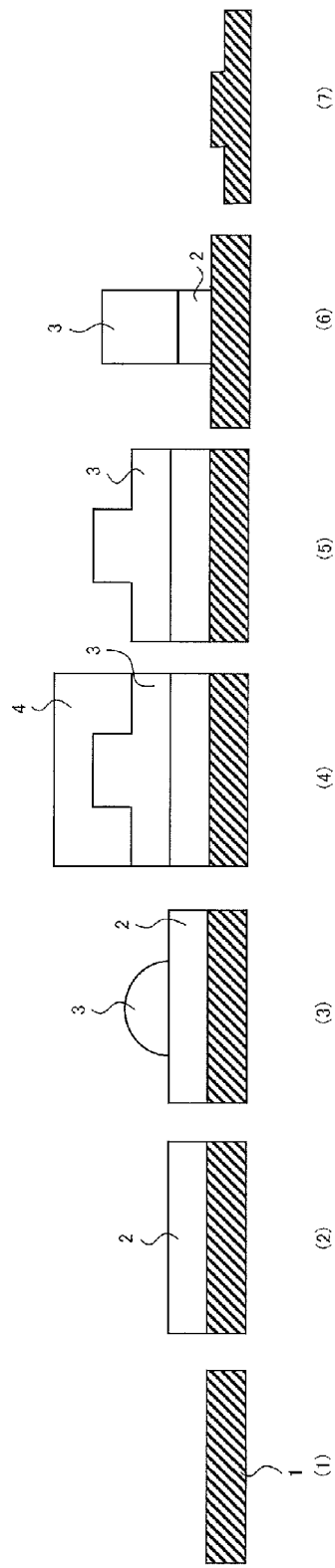

UNDER LAYER FILM-FORMING COMPOSITION FOR IMPRINTS AND METHOD OF FORMING PATTERN

This application is a Continuation of PCT International Application No. PCT/JP2013/066899 filed on Jun. 13, 2013, which claims priority under 35 U.S.C. §119(a) to Japanese Patent Application No. 2012-136896 filed on Jun. 18, 2012 and Japanese Patent Application No. 2013-063881 filed on Mar. 26, 2013. Each of the above applications are hereby expressly incorporated by reference, in its entirety, into the present application.

TECHNICAL FIELD

The present invention relates to a under layer film-forming composition for imprints used for improving adhesiveness between a curable composition for imprints and a substrate (sometimes simply referred to as "under layer film-forming composition", hereinafter). The present invention also relates to a method of forming a pattern using a cured film obtained by curing the under layer film-forming composition and a curable composition for imprints. In addition, the present invention also relates to a method of manufacturing a semiconductor device using the under layer film-forming composition, and a semiconductor device.

More precisely, the invention relates to an under layer film-forming composition for patterning through photoirradiation to give imprints, which is used in producing magnetic recording media such as semiconductor integrated circuits, flat screens, microelectromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, mold for imprint etc.

DESCRIPTION OF THE RELATED ART

Nanoimprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of nanoimprint technology have been proposed; one is a thermal nanoimprint method using a thermoplastic resin as the material to be worked (for example, see S. Chou, et al., Appl. Phys. Lett. Vol. 67, 3114 (1995)), and the other is a photonanoimprint method using a photocurable composition (for example, see M. Colbun, et al., Proc. SPIE, Vol. 3676, 379 (1999)). In the thermal nanoimprint method, a mold is pressed against a polymer resin heated up to a temperature not lower than the glass transition temperature thereof, then the resin is cooled and thereafter released from the mold to thereby transfer the microstructure of the mold onto the resin on a substrate. This method is very simple and convenient, and is applicable to a variety of resin materials and glass materials.

On the other hand, imprinting is known as a method of transferring a micro-pattern onto a photo-cured material, by allowing a curable composition to cure under photo-irradiation through a translucent mold or a translucent substrate, and then by separating the mold. The imprinting may be implemented at room temperature, so that it is applicable to the field of precision working typically for forming ultra-fine patterns such as semiconductor integrated circuit. In recent years, new trends in development of nano-casting based on combination of advantages of the both, and reversal imprinting capable of creating a three-dimensional laminated structure have been reported.

Applications listed below have been proposed for the imprinting.

A first application relates to that a geometry (pattern) per se obtained by molding is functionalized so as to be used as a nano-technology component, or a structural member. Examples of which include a variety of micro- or nano-optical component, high-density recording medium, optical film, and structural member of flat panel display.

A second application relates to building-up of a laminated structure by using a mold capable of simultaneously forming a micro-structure and a nano-structure, or by simple alignment between layers, and use of the laminated structure for manufacturing μ-TAS (Micro-Total Analysis System) or biochip.

A third application relates to use of the thus-formed pattern as a mask through which a substrate is worked typically by etching. By virtue of precise alignment and a large degree of integration, this technique can replace the conventional lithographic technique in manufacturing of high-density semiconductor integrated circuit, transistors in liquid crystal display device, and magnetic material for composing next-generation hard disk called patterned medium. Approaches for implementing the imprinting in these applications have been becoming more active in recent years.

With progress of activities in the imprinting, there has been emerging a problem of adhesiveness between the substrate and the curable composition for imprints. In the imprinting, the curable composition for imprints is coated over the substrate, and is allowed to cure under photo-irradiation, while being brought into contact on the surface thereof with a mold, and then the mold is separated. In the process of separating the mold, the cured product may sometimes separate from the substrate, and unfortunately adhere to the mold. This is supposedly because the adhesiveness between the substrate and the cured material is smaller than the adhesiveness between the mold and the cured material. As a solution to this problem, there has been discussed an under layer film-forming composition for imprints for enhancing the adhesiveness between the substrate and the cured material (Patent Literature 1, Patent Literature 2).

CITATION LIST

Patent Literature

[Patent Literature 1] JP-A-2009-503139
[Patent Literature 2] JP-A-2010-526426

Non Patent Literature

[Non Patent Literature 1] S. Chou et al.: Appl. Phys. Lett. Vol. 67, 3114(1995)
[Non Patent Literature 2] M. Colbun et al: Proc. SPIE, Vol. 3676, 379 (1999)

SUMMARY OF THE INVENTION

Technical Problem

Investigations into the under layer film-forming composition described in Patent Literature 1, however, revealed that the adhesiveness is insufficient. The present invention was directed to solve this problem, and an object of which is to provide a under layer film-forming composition with an improved adhesiveness.

Solution to Problem

Under the circumstances, the present inventors made thorough investigations, and found that the under layer film-forming composition described in Patent Literature 1 unsuccessfully resulted in poor solubility into solvent due to a novolac-based resin used therein, eventually increased in surface roughness when the novolac-based resin was formed into a ultra-thin film, and was found to reduce the adhesiveness. A possible measure for increasing the solubility of the novolac-based resin into the solvent is to increase the degree of modification and to introduce a larger amount of acid groups. In contrast, the present inventors found out that the problem of adhesiveness may be solved by changing the resin to (meth)acrylic resin, while leaving the content of the acid groups to a low level. We also surprisingly found out that, when (meth)acrylic resin was used, the smaller the content of the acid groups, the better the adhesiveness, which led us to complete a first embodiment of the present invention.

In further thorough investigations, we also found that the adhesiveness could further be improved by introducing, into the (meth)acrylic resin, a cyclic substituent having a carbonyl group in the cyclic structure thereof, which led us to complete a second embodiment of the present invention. The improvement in the adhesiveness in the second embodiment is supposedly ascribable to increase in interaction between the (meth)acrylic resin and the substrate, since the carbonyl group in the cyclic structure has a large dipole moment, and the direction of dipole moment is fixed.

More specifically, the problem was solved by a means <1> described below, and more preferably by means <2> to <19>.

<1> 1. An under layer film-forming composition for imprints comprising a (meth)acrylic resin (A) and a solvent (B), wherein the (meth)acrylic resin (A) contains an ethylenic unsaturated group (P) and a nonionic hydrophilic group (Q), and has a weight average molecular weight of 1,000 or larger and an acid value of smaller than 1.0 mmol/g.
<2> The under layer film-forming composition for imprints of <1>, wherein the resin (A) contains a repeating unit represented by the formula (I) below and/or a repeating unit represented by the formula (II) below:

[Chemical Formula 1]

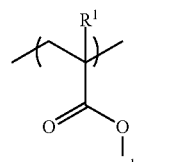

Formula (I)

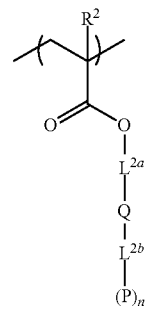

Formula (II)

(in the formulae (I) and (II), each of $R^1$ and $R^2$ independently represents a hydrogen atom, methyl group or hydroxymethyl group, $L^1$ represents a trivalent linking group, $L^{2a}$ represents a single bond or divalent linking group, $L^{2b}$ represents a single bond, divalent linking group or trivalent linking group, P represents an ethylenic unsaturated group, Q represents a nonionic hydrophilic group, and n represents 1 or 2.)

<3> The under layer film-forming composition for imprints of <1> or <2>,
wherein the resin (A) further contains a repeating unit represented by the formula (III) below and/or a repeating unit represented by the formula (IV) below:

[Chemical Formula 2]

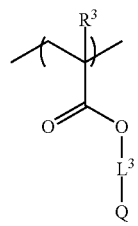

Formula (III)

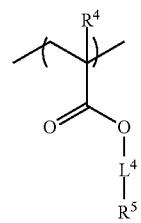

Formula (IV)

(in the formula (III) and (IV), each of $R^3$ and $R^4$ independently represents a hydrogen atom, methyl group or hydroxymethyl group, each of $L^3$ and $L^4$ independently represents a single bond or divalent linking group, Q represents a nonionic hydrophilic group, and $R^5$ represents a $C_{1-12}$ aliphatic group, $C_{3-12}$ alicyclic group or $C_{6-12}$ aromatic group.)

<4> The under layer film-forming composition for imprints of any one of <1> to <3>, wherein the ethylenic unsaturated group (P) is a (meth)acryloyloxy group.

<5> The under layer film-forming composition for imprints of any one of <1> to <4>, wherein the nonionic hydrophilic group (Q) represents an alcoholic hydroxy group or urethane group.

<6> The under layer film-forming composition for imprints of <1>, wherein the resin (A) is resin (A2) which contains, as a nonionic hydrophilic group (Q), a cyclic substituent (Q2) having a carbonyl group in the cyclic structure thereof.

<7> The under layer film-forming composition for imprints of <6>, wherein the (meth)acrylic resin (A2) is a copolymer containing a repeating unit represented by the formula (V) and/or a repeating unit represented by the formula (VI):

[Chemical Formula 3]

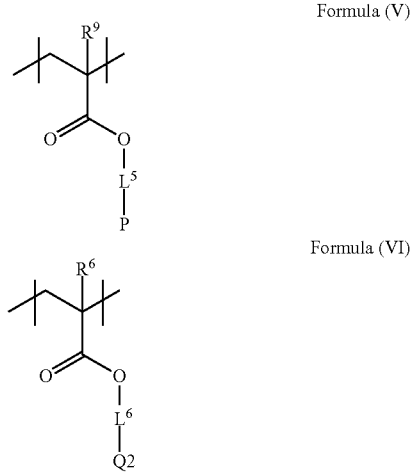

Formula (V)

Formula (VI)

(in the formulae (V) and (VI), each of $R^9$ and $R^6$ independently represents a hydrogen atom, methyl group or hydroxymethyl group, and each of $L^5$ and $L^6$ independently represents a single bond or divalent linking group. P represents an ethylenic unsaturated group, and Q2 represents a cyclic substituent having a carbonyl group in the cyclic structure thereof.)

<8> The under layer film-forming composition for imprints of <6> or <7>, wherein the ethylenic unsaturated group (P) is a (meth)acryloyloxy group.

<9> The under layer film-forming composition for imprints of any one of <6> to <8>, wherein the cyclic substituent (Q2) having a carbonyl group in the cyclic structure thereof is selected from a lactone group (Q2-1) and a cyclic carbonate group (Q2-2).

<10> The under layer film-forming composition for imprints of any one of <6> to <8>, wherein the cyclic substituent (Q2) having a carbonyl group in the cyclic structure thereof is a γ-butyrolactone group (Q2-1-1) or an ethylene carbonate group (Q2-2-1).

<11> The under layer film-forming composition for imprints of any one of <1> to <10>, wherein the (meth)acrylic resin (A) and/or the (meth)acrylic resin (A2) are a copolymer containing 20 mol % or more of a repeating unit having an ethylenic unsaturated group (P), and 40 mol % or more of a repeating unit having a nonionic hydrophilic group.

<12> The under layer film-forming composition for imprints of any one of <7> to <11>, wherein the (meth)acrylic resin (A2) is a copolymer containing 20 to 95 mol % of the repeating unit represented by the formula (V), and 5 to 80 mol % of the repeating unit represented by the formula (VI).

<13> The under layer film-forming composition for imprints of any one of <1> to <12>, wherein the (meth)acrylic resin (A) and/or the (meth)acrylic resin (A2) account for 95% by mass or more of the total components excluding solvent.

<14> The under layer film-forming composition for imprints of any one of <1> to <13>, containing 0.05 to 1.0% by mass of the (meth)acrylic resin (A) and/or the (meth)acrylic resin (A2), and 98.0 to 99.95% by mass of the solvent (B).

<15> The under layer film-forming composition for imprints of any one of <1> to <14>, wherein the (meth)acrylic resin (A) and/or the (meth)acrylic resin (A2) have an acid value of smaller than 0.3 mmol/g.

<16> A laminate comprising an under layer film formed, on a surface of a substrate, by curing the under layer film-forming composition for imprints described in any one of <1> to <15>.

<17> A method of forming a pattern comprising: applying the under layer film-forming composition for imprints described in any one of <1> to <15> onto a surface of a substrate to thereby form a under layer film; and applying a curable composition for imprints onto a surface of the under layer film.

<18> The method of forming a pattern of <17>, further comprising, after applying the under layer film-forming composition for imprints onto the surface of the substrate, allowing a part of the under layer film-forming composition for imprints to cure through heat or photo-irradiation, and applying onto the surface thereof the curable composition for imprints.

<19> The method of forming a pattern of <18>, further comprising irradiating light onto the curable composition for imprints and the under layer, while holding them between the substrate and a mold with fine patterns, to thereby cure the curable composition for imprints, and separating the mold.

<20> A method of manufacturing a semiconductor device comprising the method of forming a pattern described in any one of <17> to <19>.

Advantageous Effects of Invention

By using the under layer film-forming composition for imprints of the present invention, it now became possible to provide the under layer film excellent in the surface planarity.

BRIEF DESCRIPTION OF DRAWINGS

FIG. 1 illustrates an exemplary manufacturing process when the curable composition for imprints is used for working of a substrate by etching.

DESCRIPTION OF EMBODIMENTS

The contents of the invention are described in detail hereinunder. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. In the invention, monomer is differentiated from oligomer and polymer, and the monomer indicates a compound having a weight-average molecular weight of at most 1,000. In this specification, "functional group" means a group relevant to polymerization reaction.

"Imprint" referred to in the invention is meant to indicate pattern transfer in a size of from 1 nm to 10 mm and preferably meant to indicate pattern transfer in a size of from about 10 nm to 100 μm (nanoimprint).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

The nonionic hydrophilic group in the context of the present invention means a nonionic polar group containing one or more hetero atom (preferably N or O).

According to the first embodiment of the present invention, there is provided an under layer film-forming composition for imprints which includes a (meth)acrylic resin (A) having an ethylenic unsaturated group (P) and a nonionic hydrophilic group (Q), and having a weight average molecular weight of 1,000 or larger; and a solvent (B), the resin (A) having an acid value of smaller than 1.0 mmol/g.

The acid value in the context of the present invention represents the number of millimoles of acid group per unit mass. The acid value is measurable by a potentiometric titration. More specifically, a resin is dissolved into a titration solvent (for example, a 9:1 mixed solvent of propylene glycol monomethyl ether and water), and the solution is titrated with a 0.1 mol/L aqueous potassium hydroxide solution. The acid value may be calculated based on a titer consumed up to an inflection point on a titration curve.

The resin (A) preferably has an acid value of smaller than 0.3 mmol/g, and more preferably smaller than 0.05 mmol/g, but preferably has substantially no acid group. The expression of "has substantially no acid group" herein means that the acid group is under the detectable limit when measured by the method described above.

The acid group is exemplified by groups capable of releasing a proton, and salts thereof. Specific examples include carboxy group, sulfo group, and phosphonic acid group. The present invention is particularly effective when the carboxy group is not contained.

The ethylenic unsaturated group (P) is exemplified by (meth)acryloyloxy group, (meth)acryloylamino group, maleimide group, allyl group, and vinyl group, wherein (meth)acryloyloxy group is preferable.

The nonionic hydrophilic group (Q) is exemplified by alcoholic hydroxy group, phenolic hydroxy group, ether group (preferably polyoxyalkylene group or cyclic ether group), amino group (including cyclic amino group), amide group, imide group, ureido group, urethane group, cyano group, sulfonamide group, lactone group, and cyclocarbonate group. Among them, alcoholic hydroxy group, polyoxyalkylene group, amino group, amide group, ureido group, urethane group, and cyano group are more preferable, alcoholic hydroxy group, urethane group, polyoxyalkylene group, and ureido group are still more preferable, and alcoholic hydroxy group and urethane group are particularly preferable.

Content of the repeating unit having the ethylenic unsaturated group (P) in the resin (A) is preferably 20 mol % or more, more preferably 30 mol % or more, still more preferably 40 mol % or more, and particularly 50 mol % or more.

Content of the repeating unit having the nonionic hydrophilic group (Q) in the resin (A) is preferably 40 mol % or more, more preferably 50 mol % or more, still more preferably 60 mol % or more, and particularly 70 mol % or more.

The ethylenic unsaturated group (P) and the nonionic hydrophilic group (Q) may be contained in the same repeating unit, or may be contained in separate repeating units.

The resin (A) may contain still another repeating unit having neither the ethylenic unsaturated group (P) nor the nonionic hydrophilic group (Q). Ratio of such another repeating unit in the resin (A) is preferably 50 mol % or smaller.

The resin (A) preferably contains the repeating unit represented by the formula (I) and/or the repeating unit represented by the formula (II) below:

[Chemical Formula 4]

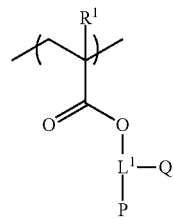

Formula (I)

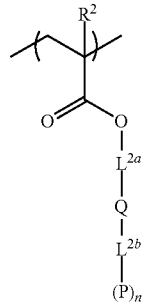

Formula (II)

(in the formulae (I) and (II), each of $R^1$ and $R^2$ independently represents a hydrogen atom, methyl group or hydroxymethyl group, $L^1$ represents a trivalent linking group, $L^{2a}$ represents a single bond or divalent linking group, $L^{2b}$ represents a single bond, divalent linking group or trivalent linking group, P represents an ethylenic unsaturated group, Q represents a nonionic hydrophilic group, and n is 1 or 2).

Each of $R^1$ and $R^2$ independently represents a hydrogen atom, methyl group, or hydroxymethyl group, wherein hydrogen atom and methyl group are preferable, and methyl group is more preferable.

$L^1$ represents a trivalent linking group, which is an aliphatic group, alicyclic group, aromatic group, or trivalent group formed by combining them, and may contain an ester bond, ether bond, sulfide bond or nitrogen atom. The trivalent linking group preferably has 1 to 9 carbon atoms.

$L^{2a}$ represents a single bond or divalent linking group. The divalent linking group is an alkylene group, cycloalkylene group, arylene group, or divalent group formed by combining them, and may contain an ester bond, ether bond or sulfide bond. The divalent linking group preferably has 1 to 20 carbon atoms, and more preferably has 1 to 8 carbon atoms.

$L^{2b}$ represents a single bond, divalent linking group, or trivalent linking group. The divalent linking group represented by $L^{2b}$ is synonymous to the divalent linking group represented by $L^{2a}$, with the same preferable ranges. The trivalent linking group represented by $L^{2b}$ is synonymous to the trivalent linking group represented by $L^1$, with the same preferable ranges.

P represents an ethylenic unsaturated group, and is synonymous to the ethylenic unsaturated group exemplified above, with the same preferable examples.

Q represents a nonionic hydrophilic group, and is synonymous to the nonionic hydrophilic group exemplified above, with the same preferable examples.

n is 1 or 2, and preferably 1.

All of $L^1$, $L^{2a}$ and $L^{2b}$ have neither ethylenic unsaturated group nor nonionic hydrophilic group.

The resin (A) may additionally have the repeating units represented by the formula (III) and/or the formula (IV) below:

[Chemical Formula 5]

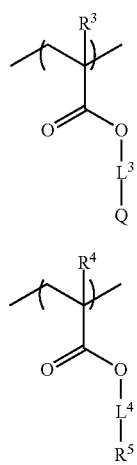

Formula (III)

Formula (IV)

(in the formulae (III) and (IV), each of $R^3$ and $R^4$ independently represents a hydrogen atom, methyl group or hydroxymethyl group, each of $L^3$ and $L^4$ independently represents a single bond or divalent linking group, Q represents a nonionic hydrophilic group, and $R^5$ represents a $C_{1-12}$ aliphatic group, $C_{3-12}$ alicyclic group or $C_{6-12}$ aromatic group).

Each of $R^3$ and $R^4$ independently represents a hydrogen atom, methyl group or hydroxymethyl group, wherein hydrogen atom and methyl group are preferable, and methyl group is more preferable.

Each of $L^3$ and $L^4$ independently represents a single bond or divalent linking group. The divalent linking group is synonymous to the divalent linking group represented by $L^{2a}$ in the formula (I), with the same preferable ranges.

Q represents a nonionic hydrophilic group, and is synonymous to the nonionic hydrophilic group exemplified above, with the same preferable examples.

Neither $L^3$ nor $L^4$ may have ethylenic unsaturated group and nonionic hydrophilic group.

Specific examples of the repeating unit having the nonionic hydrophilic group are listed below, without limiting the present invention. Each $R^3$ independently represents a hydrogen atom, methyl group or hydroxymethyl group.

[Chemical Formula 6]

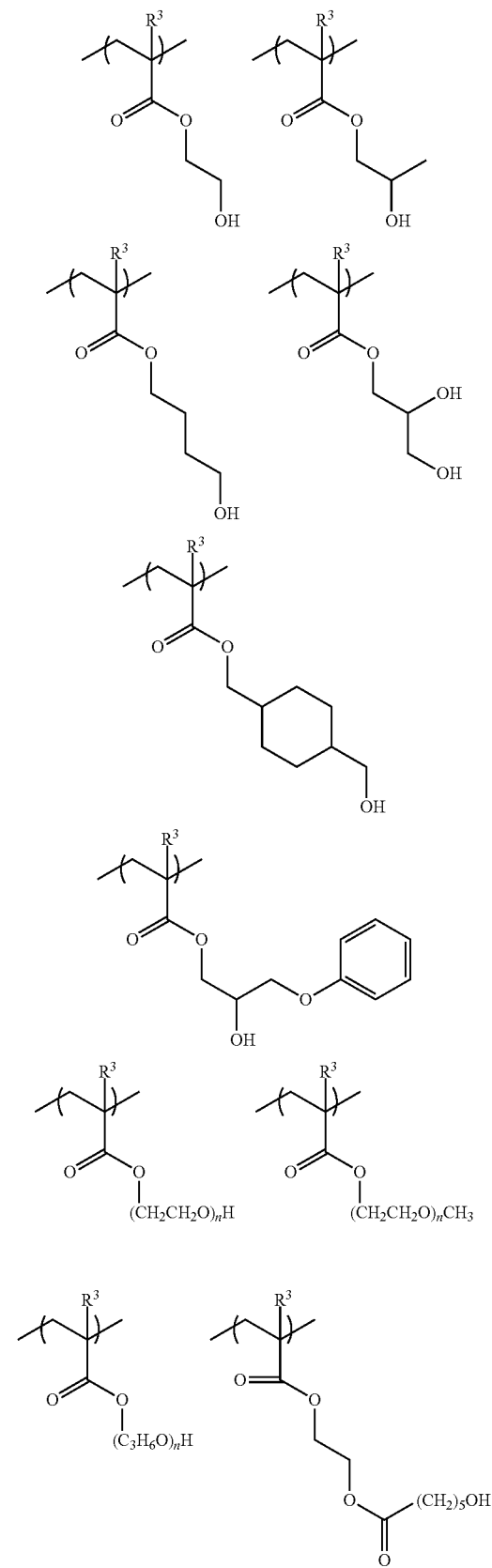

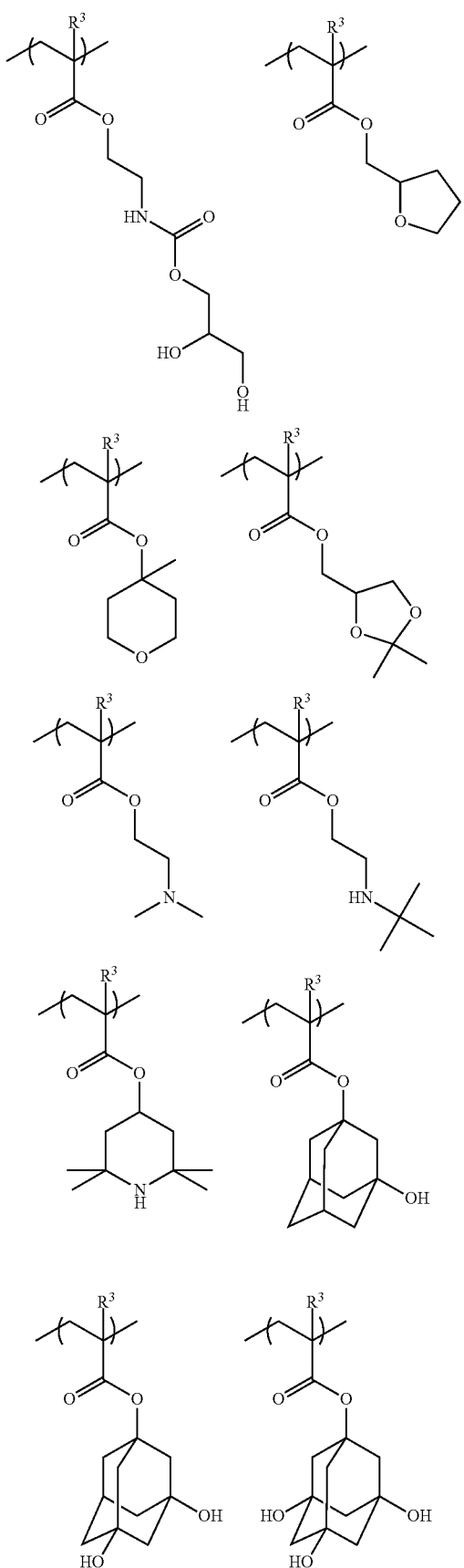

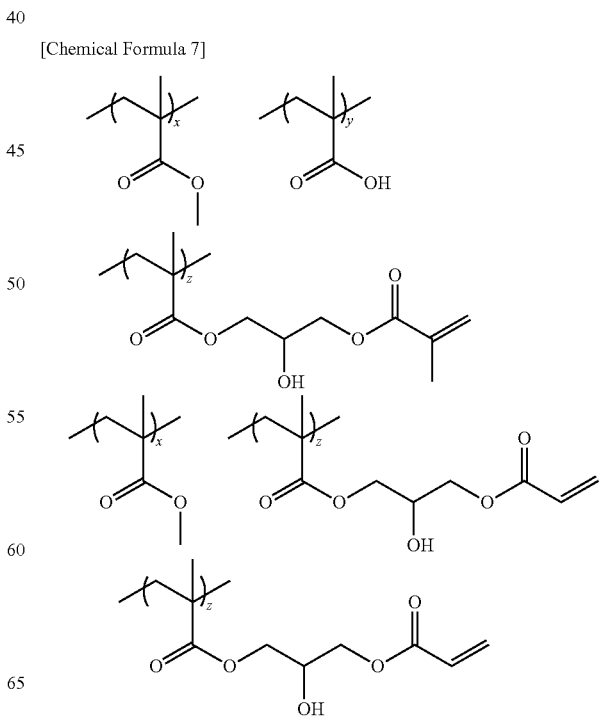

In the formula (IV), $R^5$ represents a $C_{1-12}$ aliphatic group, $C_{3-12}$ alicyclic group or $C_{6-12}$ aromatic group.

The $C_{1-12}$ aliphatic group is exemplified by $C_{1-12}$ alkyl groups (for example, methyl group, ethyl group, propyl group, isopropyl group, butyl group, isobutyl group, t-butyl group, pentyl group, isopentyl group, neopentyl group, hexyl group, heptyl group, octyl group, 2-ethylhexyl group, 3,3,5-trimethylhexyl group, isooctyl group, nonyl group, isononyl group, decyl group, isodecyl group, undecyl group, and dodecyl group).

The $C_{3-12}$ alicyclic group is exemplified by $C_{3-12}$ cycloalkyl groups (for example, cyclopentyl group, cyclohexyl group, norbornyl group, isobornyl group, adamantyl group and tricyclodecanyl group).

The $C_{6-12}$ aromatic group is exemplified by phenyl group, naphthyl group, and biphenyl group. Among them, phenyl group and naphthyl group are preferable.

The aliphatic group, alicyclic group and aromatic group may have a substituent.

Specific examples of the resin (A) used in the present invention are listed below. In the specific examples below, x stands for 0 to 50 mol %, y stands for 0 to 50 mol %, and z stands for 20 to 100 mol %.

[Chemical Formula 7]

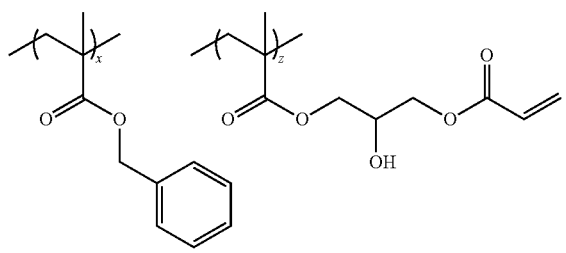
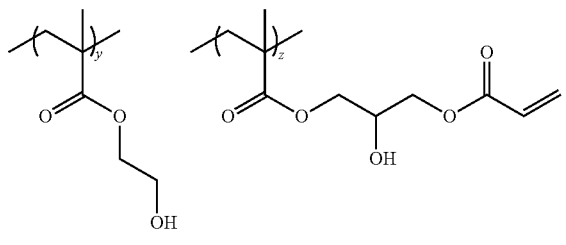
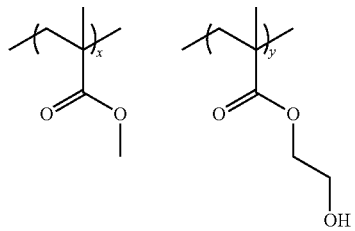
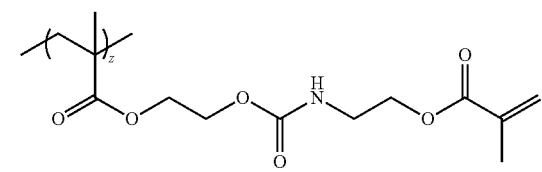
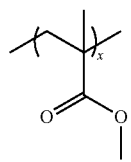
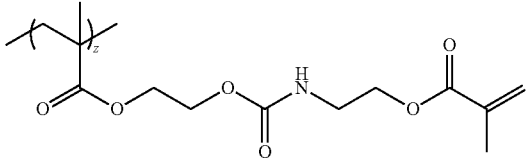
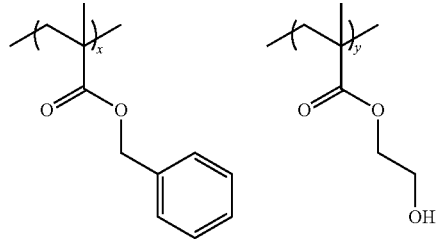
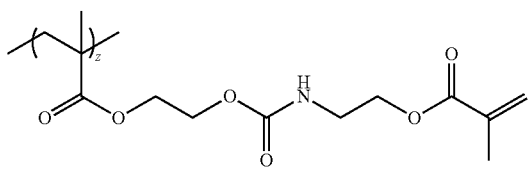

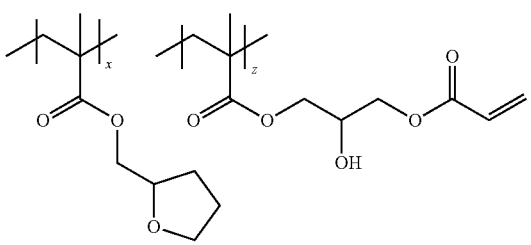
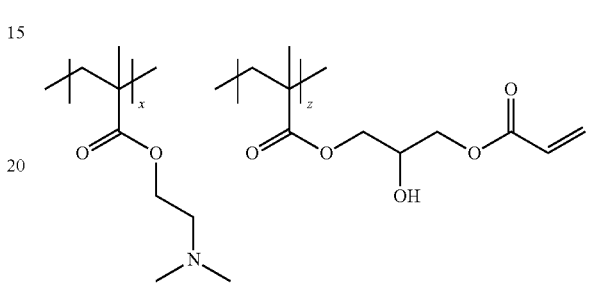

Weight average molecular weight of the resin (A) is 1,000 or larger, preferably 3,000 or larger, and more preferably 5,000 or larger. The upper limit of the weight average molecular weight is preferably 100,000 or smaller, more preferably 50,000 or smaller, and furthermore preferably 30,000 or smaller. By adjusting the weight average molecular weight to 1,000 or larger, a good film formability is expectable.

Content of the resin (A) is preferably 50% by mass or more of the total components excluding the solvent, more preferably 70% by mass or more, furthermore preferably 90% by mass or more, and particularly 95% by mass or more.

According to the second embodiment of the present invention, there is provided the under layer film-forming composition which includes a (meth)acrylic resin (A2) containing an ethylenic unsaturated group (P), and containing, as a nonionic hydrophilic group (Q), a cyclic substituent (Q2) having a carbonyl group in the cyclic structure thereof, with a weight average molecular weight of 1,000 or larger; and a solvent (B).

The resin (A2) preferably has an acid value of smaller than 1.0 mmol/g, more preferably smaller than 0.3 mmol/g, furthermore preferably smaller than 0.05 mmol/g, but preferably has substantially no acid group. By adjusting the acid value into these ranges, the effects of the present invention will be exhibited in a more effective manner.

The (meth)acrylic resin (A2) may contain the ethylenic unsaturated group (P) and the cyclic substituent (Q2) having a carbonyl group in the cyclic structure thereof, in the same repeating unit, or in the separate repeating units. The (meth)acrylic resin (A2) is preferably a copolymer which contains a repeating unit having the ethylenic unsaturated group (P) (for example, the repeating unit represented by the formula (V) below), and a repeating unit having the cyclic substituent (Q2) having a carbonyl group in the cyclic structure thereof (for example, the repeating unit represented by the formula (VI) below):

[Chemical Formula 8]

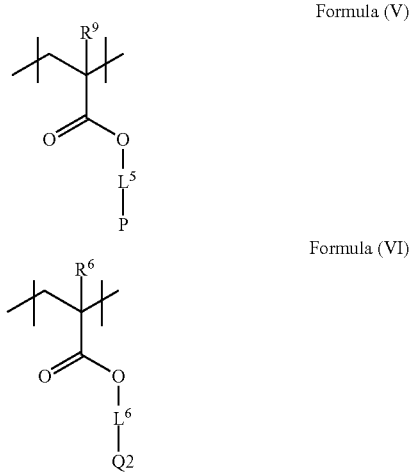

Formula (V)

Formula (VI)

(in the formulae (V) and (VI), each of $R^9$ and $R^6$ independently represents a hydrogen atom, methyl group or hydroxymethyl group, and each of $L^5$ and $L^6$ independently represents a single bond or divalent linking group. P represents an ethylenic unsaturated group, and Q2 represents a cyclic substituent having a carbonyl group in the cyclic structure thereof).

Each of $L^5$ and $L^6$ represents a single bond or $C_{1-10}$ divalent linking group. The divalent linking group is an unsubstituted or hydroxy-substituted alkylene group, and may have an ether bond, ester bond, amide bond or urethane bond.

Each of $L^5$ and $L^6$ need not necessarily have an ethylenic unsaturated group or nonionic hydrophilic group.

The resin (A2) may contain still another repeating unit which has neither the ethylenic unsaturated group (P) nor the cyclic substituent (Q2) having a carbonyl group in the cyclic structure thereof. Ratio of such another repeating unit in the resin (A2) is preferably 50 mol % or smaller.

When the (meth)acrylic resin (A2) is a copolymer, ratio of the repeating unit having the ethylenic unsaturated group (P) (for example, a repeating unit represented by the formula (V) above) is preferably 20 to 95 mol % of the total repeating units, more preferably 30 to 90 mol %, furthermore preferably 40 to 85 mol %, and particularly 50 to 80 mol %.

Ratio of the repeating unit having an alicyclic group (Q2) having a carbonyl group in the cyclic structure thereof (for example, a repeating unit represented by the formula (VI) above) is preferably 5 to 80 mol % of the total repeating units, more preferably 10 to 70 mol %, furthermore preferably 15 to 60 mol %, and particularly 20 to 50 mol %.

The ethylenic unsaturated group (P) is exemplified by (meth)acryloyloxy group, (meth)acryloylamino group, maleimide group, allyl group, and vinyl group, wherein (meth)acryloyloxy group is preferable.

The cyclic substituent (Q2) having a carbonyl group in the cyclic structure thereof is exemplified by lactone group (cyclic ester group) (Q2-1), cyclic carbonate group (Q2-2), cyclic ketone group, cyclic amide (lactam) group, cyclic urethane group, cyclic urea group, cyclic dicarboxylic anhydride group, and cyclic imide group. Among them, lactone group or cyclic carbonate group is more preferable, and lactone group is particularly preferable.

The lactone group (Q2-1) is a residue remained after elimination of one hydrogen atom from the lactone structure. The lactone structure is preferably a five- to seven-membered-ring lactone structure, and preferably has a lactone structure represented by any one of the formulae (Q2-1-1) to (Q2-1-17) below. The lactone structural moiety need not necessarily have substituent ($R^7$). Preferable examples of the substituent ($R^7$) include $C_{1-8}$ alkyl group, $C_{4-7}$ cycloalkyl group, $C_{1-8}$ alkoxy group, $C_{2-8}$ alkoxy carbonyl group, carboxy group, hydroxy group, and cyano group. More preferable examples include methyl group, ethyl group, hydroxy group, and methoxycarbonyl group. m represents an integer from 0 to 4. When m is 2 or larger, the plurality of substituents ($R^7$) may be same or different, or may combine to each other to form a ring.

The lactone structure is more preferably exemplified by (Q2-1-1), (Q2-1-2), (Q2-1-5), (Q2-1-14) and (Q2-1-17) below, and particularly by (Q2-1-1). By using such specific lactone structures, the under layer layer may be improved in the planarity, adhesiveness, etchability, and readiness of removal of etching residue. In the formulae below, $R^7$ is preferably any of the substituent described above, and is more preferably a methyl group, ethyl group, hydroxy group, or methoxycarbonyl group.

[Chemical Formula 9]

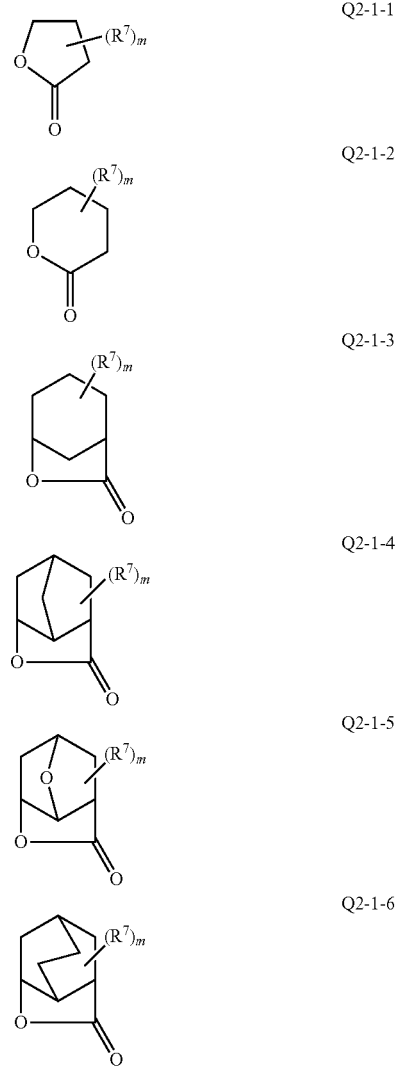

Q2-1-7
Q2-1-8
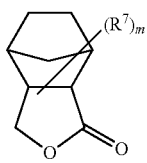
Q2-1-9
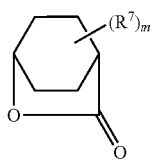
Q2-1-10
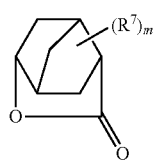
Q2-1-11
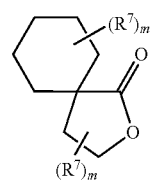
Q2-1-12
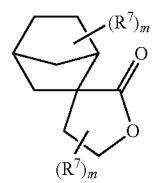
Q2-1-13
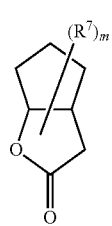
Q2-1-14
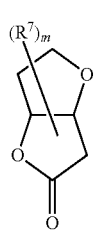
Q2-1-15
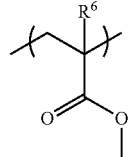
Q2-1-16
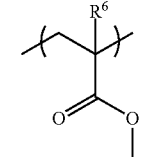
Q2-1-17
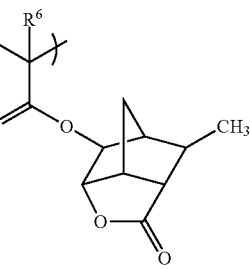
Specific examples of the repeating unit having the lactone structure are listed below, without limiting the present invention. Each $R^6$ independently represents a hydrogen atom, methyl group or hydroxymethyl group.
[Chemical Formula 10]

[Chemical Formula 11]
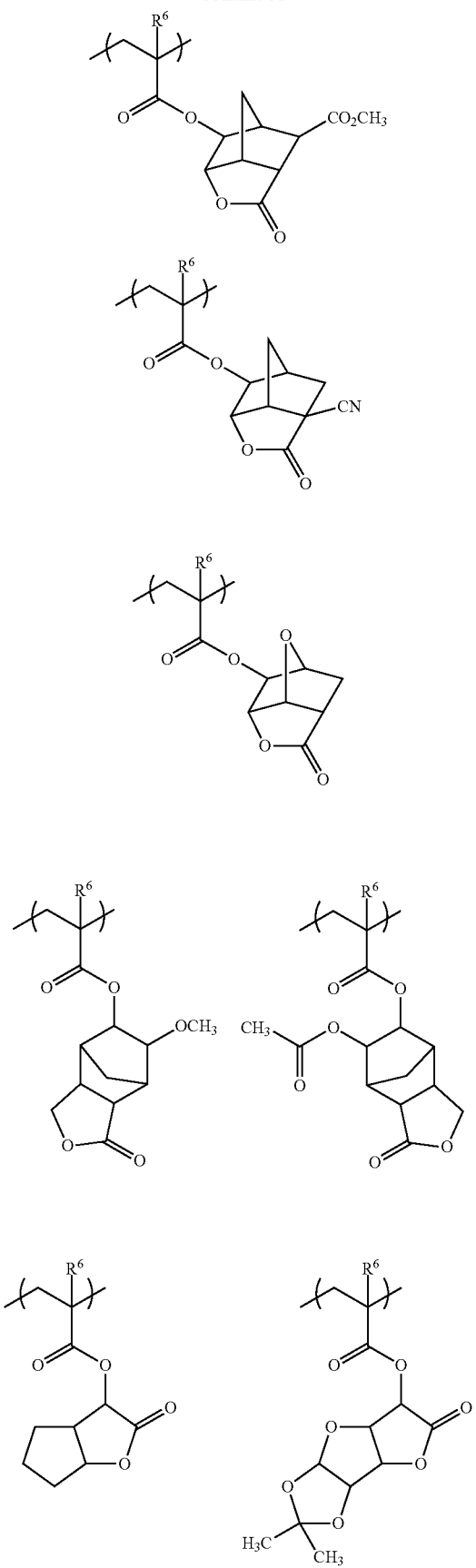
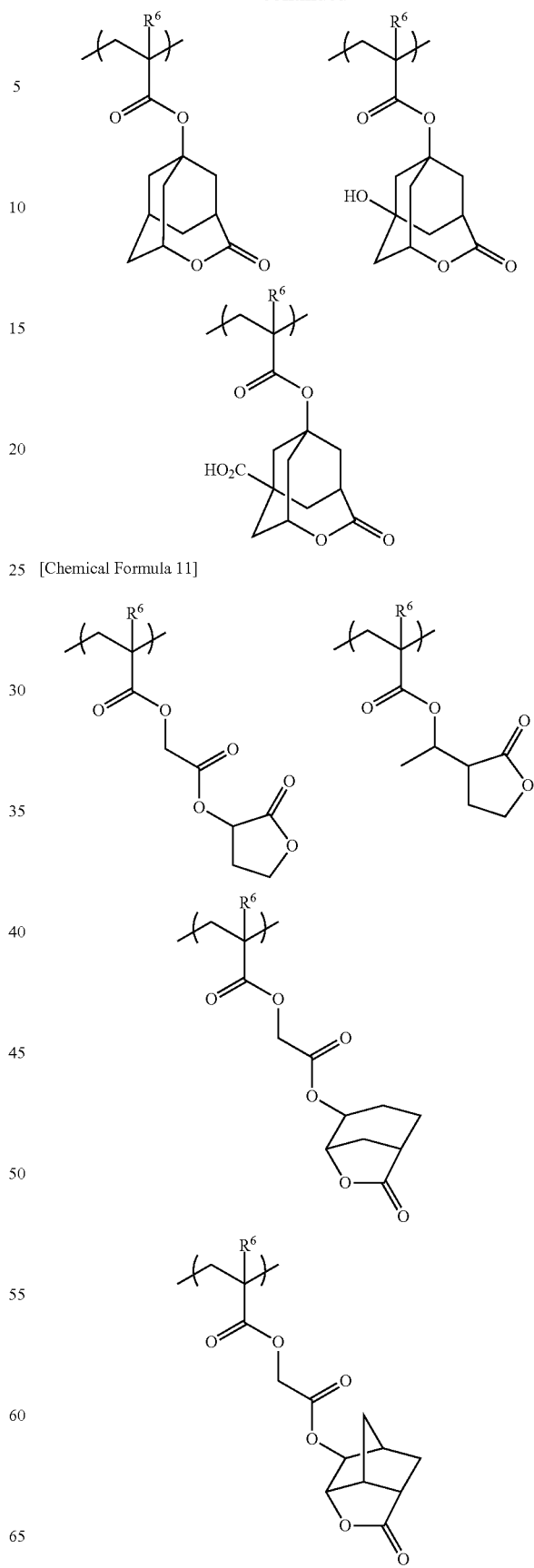

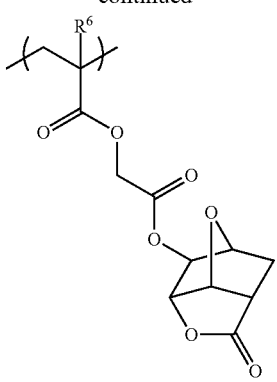

The cyclic carbonate group (Q2-2) is a residue remained after eliminating one hydrogen atom from a cyclic carbonate structure. The lactone structure is preferably a five- or six-membered-ring lactone structure, and is preferably a lactone structure represented by any of the formulae (Q2-2-1) to (Q2-2-10) below. The lactone structural moiety need not necessarily have a substituent ($R^8$). Preferable examples of the substituent ($R^8$) include $C_{1-8}$ alkyl group, $C_{4-7}$ cycloalkyl group, $C_{1-8}$ alkoxy group, $C_{2-8}$ alkoxycarbonyl group, carboxy group, hydroxy group, and cyano group. More preferable examples include methyl group and hydroxy group. m represents an integer from 0 to 4. When m is 2 or larger, the plurality of substituents ($R^8$) may be same or different, or may combine to each other to form a ring.

The lactone structure is more preferably exemplified by (Q2-2-1), (Q2-2-2) and (Q2-2-6) below, and particularly (Q2-2-1). By using such specific lactone structure, the under layer film may be improved in planarity, adhesiveness, etchability, and readiness of removal of etching residue.

[Chemical Formula 12]

Q2-2-1
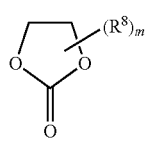

Q2-2-2
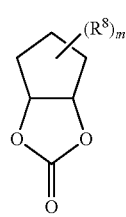

Q2-2-3
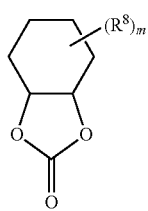

Q2-2-4
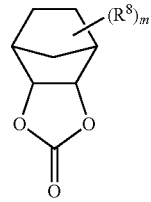

Q2-2-5
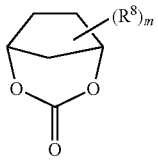

Q2-2-6
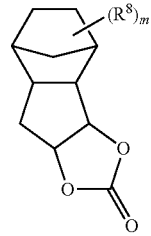

Q2-2-7
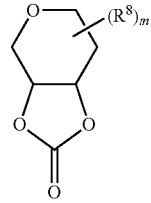

Q2-2-8
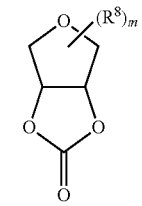

Q2-2-9
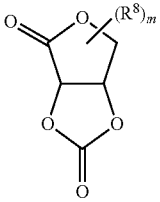

Q2-2-10
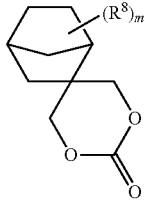

Specific examples of the repeating unit having the cyclic carbonate structure are listed below, without limiting the present invention.

[Chemical Formula 13]
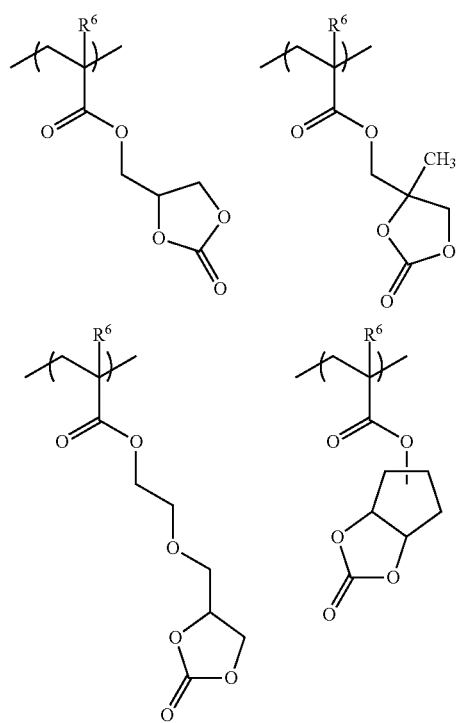
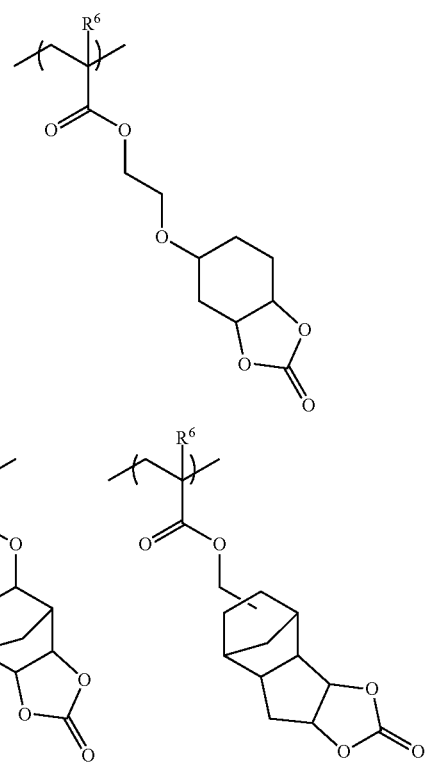
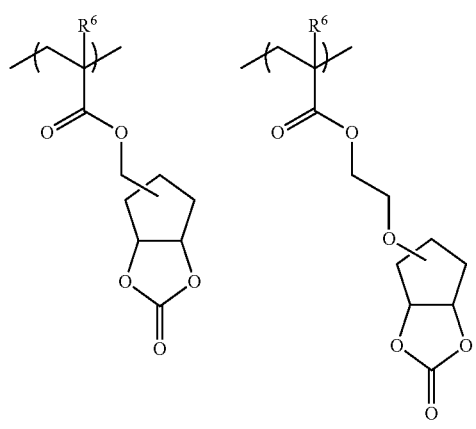
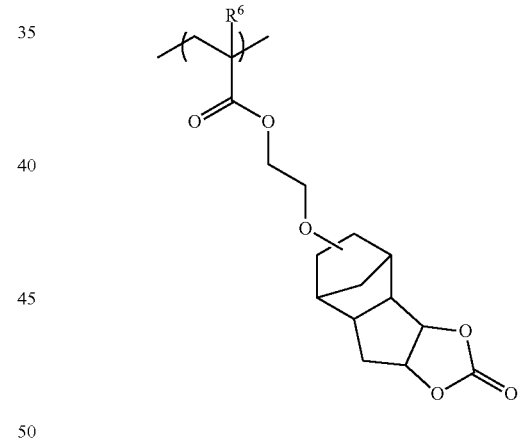
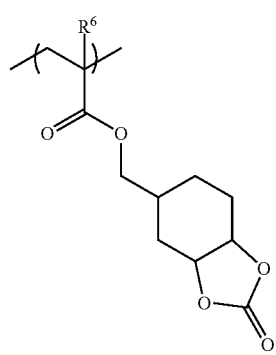
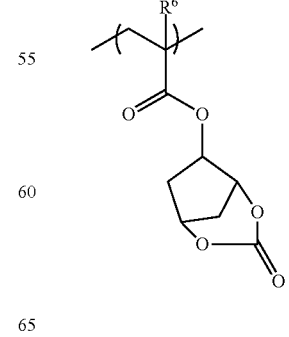
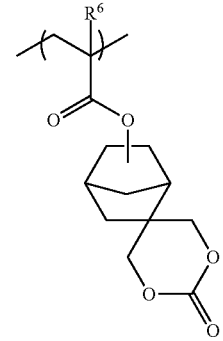

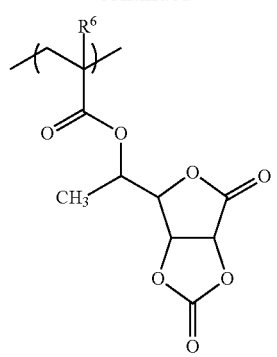

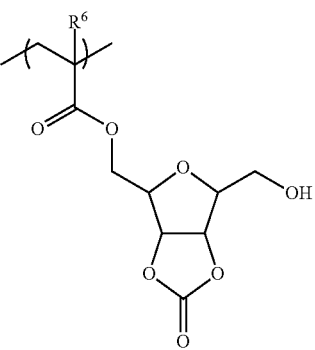

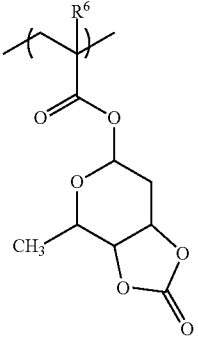

Specific examples of the resin (A2) used in the present invention are listed below. In the specific examples, x stands for 5 to 95 mol %, y stands for 0 to 50 mol %, and z stands for 5 to 95 mol %.

[Chemical Formula 14]

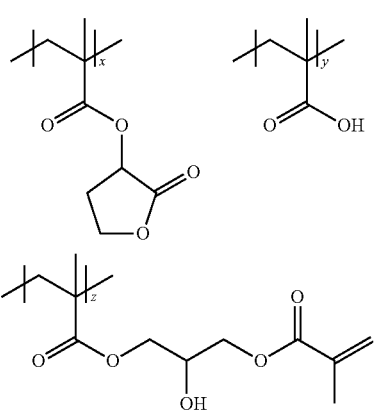

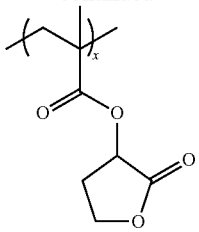

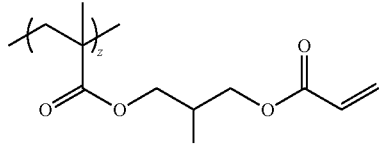

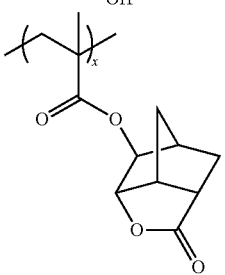

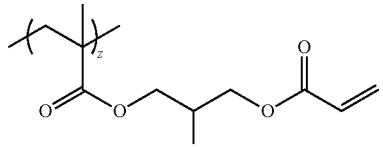

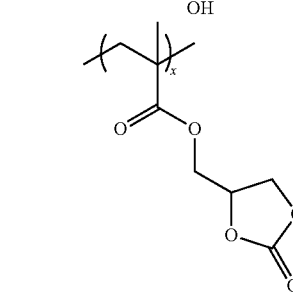

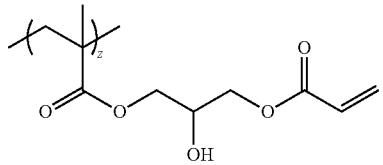

The resin (A2) has a weight average molecular weight of 1,000 or larger, with a preferable range same as that of the resin (A).

Preferable range of the content of the resin (A2) is same as that of the resin (A).

The second embodiment of the under layer film-forming composition of the present invention contains the solvent (B). Preferable range of the solvent in the second embodiment is same as that in the first embodiment. Preferable range of the content of the solvent in the second embodiment is same as that in the first embodiment.

In the present invention, also a composition containing both of the resin (A) and the resin (A2) disclosed in the first embodiment may be exemplified as a preferable embodiment of the present invention. In this case, the total content of the resin (A) and the resin (A2) preferably falls in the preferable range of the total content of the resin.

The under layer film-forming composition of the present invention contains the solvent (B). Preferable solvent is such as those having the boiling point at normal pressure in the range from 80 to 200° C. The solvent is arbitrarily selectable from those capable of dissolving therein the under layer film-forming composition, and preferably has at least one of ester group, carbonyl group, hydroxy group and ether group. More specifically, examples of preferable solvent include propylene glycol monomethyl ether acetate (PGMEA), ethoxyethyl propionate, cyclohexanone, 2-heptanone, γ-butyrolactone, butyl acetate, propylene glycol monomethyl ether, and ethyl lactate. Among them, PGEMA, ethoxyethyl propionate and 2-heptanone are more preferable, and PGMEA is particularly preferable. Two or more species of solvent may be used by mixing. Also a mixed solvent of a solvent having a hydroxy group and a solvent having no hydroxy group is preferable.

Content of the solvent in the under layer film-forming composition of the present invention is optimally adjusted depending on viscosity of the composition and a desired thickness of the under layer film. From the viewpoint of good coatability, amount of addition of the solvent is preferably 70% by mass or more of the composition, more preferably 90% by mass or more, furthermore preferably 95% by mass or more, and particularly 99% by mass or more.

In particular, the under layer film-forming composition for imprints of the present invention preferably contains 0.05 to 1.0% by mass in total of the resin (A) and/or resin (A2), and 98.0 to 99.95% by mass of the solvent (B).

Other Additives

The under layer film-forming composition of the present invention may contain, as other components, crosslinking agent, acid or acid generator, polymerization inhibitor, or surfactant. Amount of addition of these components is preferably 50% by mass or less of the total components of the under layer film-forming composition, excluding the solvent, more preferably 30% by mass or less, and furthermore preferably 10% by mass or less. It is, however, particularly preferable to contain substantially no other components. The expression of "to contain substantially no other components" herein means that the other components are not intentionally added to the under layer film-forming composition, except for, for example, additives such as a reactant, catalyst and polymerization inhibitor used for synthesizing the resin (A), and impurities derived from reaction by-products. More specifically, the content may be 5% by mass or less.

Crosslinking Agent

The crosslinking agent is preferably selectable from cation-polymerizable compounds such as epoxy compound, oxetane compound, methylol compound, methylol ether compound, and vinyl ether compound.

Examples of the epoxy compound include Epolite from Kyoeisha Chemical Co. Ltd.; Denacol EX from Nagase chemteX Corporation; EOCN, EPPN, NC, BREN, GAN, GOT, AK and RE Series from Nippon Kayaku Co. Ltd.; Epicoat from Japan Epoxy Resins Co. Ltd.; Epiclon from DIC Corporation; and Tepic Series from Nissan Chemical Industries, Ltd. Two or more species of them may be used in combination.

The oxetane compound is exemplified by Eternacoll OXBP, OXTP and OXIPA from Ube Industries Ltd.; and ARON oxetane OXT-121 and OXT-221 from Toagosei Co. Ltd.

The vinyl ether compound is exemplified by Vectomer Series from Allied Signal, Inc.

The methylol compound and methylol ether compound are exemplified by urea resin, glycouril resin, melamine resin, guanamine resin, and phenol resin. Specific examples include Nikalac MX-270, MX-280, MX-290, MW-390 and BX-4000 from Sanwa Chemical Co. Ltd; and Cymel 301, 303ULF, 350 and 1123 from Cytec Industries Inc.

Acid or Acid Generator

When the crosslinking agent is contained, an acid, or thermal or photo-acid generator is preferably used. The acid usable for the under layer film-forming composition of the present invention is exemplified by p-toluenesulfonic acid and perfluorobutanesulfonic acid. The thermal acid generator is exemplified by isopropyl p-toluenesulfonate, cyclohexyl p-toluenesulfonate, and SI Series which is an aromatic sulfonate compound from Sanshin Chemical Industry Co. Ltd.

The photo-acid generator used in the present invention is exemplified by sulfonium salt compound, iodonium salt compound, and oxim sulfonate compound. Specific examples include PI2074 from Rhodia Inc.; IRGACURE 250 from BASF; and IRGACURE PAG103, 108, 121 and 203 from BASF.

Polymerization Inhibitor

The under layer film-forming composition of the present invention preferably contains a polymerization inhibitor, from the viewpoint of shelf stability. Examples of the polymerization inhibitor usable in the present invention include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), N-nitrosophenylhydroxyamine cerium (I) salt, phenothiazine, pheoxazine, 4-methoxynaphthol, 2,2,6,6-tetramethylpiperidine-1-oxyl, free radical, 2,2,6,6-tetramethylpiperidine, 4-hydroxy-2,2,6,6-tetramethylpiperidine-1-oxyl, free radical, nitrobenzene, and dimethylaniline. Among them, phenothiazine, 4-methoxynaphthol, 2,2,6,6-tetramethylpiperidine-1-oxyl, free radical, 2,2,6,6-tetramethylpiperidine, and 4-hydroxy-2,2,6,6-tetramethylpiperidine-1-oxyl, free radical are preferable, since they exhibit effects even under an anaerobic condition.

Surfactant

The under layer film-forming composition for imprints of the present invention may contain a surfactant. The surfactant is preferably a nonionic surfactant, and is preferably any of fluorine-containing, Si-based, and fluorine-containing/Si-based ones. The expression of "fluorine-containing/Si-based" means that the surfactant has features of both of fluorine-containing and Si-based surfactants. By using this sort of surfactant, uniformity of coating may be improved, and a good coated film may be obtained by coating using a spin coater or slit scan coater.

The nonionic surfactant usable in the present invention is exemplified by various series under the trade names of Fluorad (from Sumitomo 3M Ltd.), Megafac (from DIC Corporation), Surflon (from AGC Seimi Chemical Co. Ltd.), Unidyne (from Daikin Industries Ltd.), Ftergent (from NEOS Co. Ltd.), Eftop (from Mitsubishi Material Electronic Chemicals Co. Ltd.), Polyflow (from Kyoeisha Chemical Co. Ltd.), KP (from Shin-Etsu Chemical Co. Ltd.), Troysol (from Troy Chemical Industries), PolyFox (From OMNOVA Solutions Inc.), and Capstone (from DuPont).

The under layer film-forming composition of the present invention may be prepared by mixing the individual components described above. After mixing of the individual components, the mixture is preferably filtered through a filter with a pore size of 0.003 μm to 5.0 μm. The filtration may be conducted in a multi-step manner or may be repeated plural times. Filter media usable for the filtration include polyethylene resin, polypropylene resin, fluorine-containing resin and nylon resin, but not limited thereto.

<Curable Composition for Imprints>

The curable composition for imprints used together with the under layer film-forming composition of the present invention generally contains a polymerizable compound and a polymerization initiator.

Polymerizable Compound

Species of the polymerizable compound used for the curable composition for imprints used in the present invention is not specifically limited without departing from the spirit of the present invention, and is exemplified by polymerizable unsaturated monomer having 1 to 6 groups containing an ethylenic unsaturated linking groups; epoxy compound; oxetane compound; vinyl ether compound; styrene derivative; and propenyl ether and butenyl ether. The curable composition for imprints preferably has a polymerizable group which is polymerizable with the polymerizable group contained in the under layer film-forming composition of the present invention. Among them, (meth)acrylate is preferable. Specific examples of them are exemplified by those described in paragraphs [0020] to [0098] of JP-A-2011-231308, the contents of which are incorporated by reference into this patent specification.

The polymerizable compound preferably contains a polymerizable compound having an alicyclic hydrocarbon group and/or aromatic group, and more preferably contains a polymerizable compound having an alicyclic hydrocarbon group and/or aromatic group, and a polymerizable compound having a silicon atom and/or fluorine atom. Of the whole polymerizable components contained in the curable composition for imprints of the present invention, the total content of the polymerizable compounds having an alicyclic hydrocarbon group and/or aromatic group preferably accounts for 30 to 100% by mass of the total polymerizable compounds, more preferably 50 to 100% by mass, and furthermore preferably 70 to 100% by mass.

In a further preferable embodiment, a (meth)acrylate polymerizable compound having an aromatic group, used as the polymerizable compound, preferably accounts for 50 to 100% by mass of the total polymerizable components, more preferably 70 to 100% by mass, and furthermore preferably 90 to 100% by mass.

In a particularly preferable embodiment, a polymerizable compound (1) described below accounts for 0 to 80% by mass (more preferably 20 to 70% by mass) of the total polymerizable components, a polymerizable compound (2) described below accounts for 20 to 100% by mass (more preferably 50 to 100% by mass) of the total polymerizable components, and a polymerizable compound (3) described below accounts for 0 to 10% by mass (more preferably 0.1 to 6% by mass) of the total polymerizable components:

(1) polymerizable compound having an aromatic group (preferably phenyl group or naphthyl group, and more preferably naphthyl group) and a (meth)acrylate group;

(2) polymerizable compound having an aromatic group (preferably phenyl group or naphthyl group, and more preferably phenyl group), and two (meth)acrylate groups; and (3) polymerizable compound having at least either of a fluorine atom and silicon atom, and a (meth)acrylate group.

In the curable composition for imprints, content of the polymerizable compound having a viscosity at 25° C. of smaller than 5 mPa·s is preferably 50% by mass or less of the total polymerizable compounds, more preferably 30% by mass or less, and furthermore preferably 10% by mass or less. By adjusting the content in the ranges described above, ink-jetting stability may be improved, and thereby defects in transfer-by-imprint may be reduced.

Polymerization Initiator

The curable composition for imprints used in the present invention contains a photo-polymerization initiator. The photo-polymerization initiator used in the present invention is arbitrarily selectable from those generating an active species capable of polymerizing the above-described polymerizable compounds under photo-irradiation. The photo-polymerization initiator is preferably a radical polymerization initiator or cation polymerization initiator, and more preferably a radical polymerization initiator. In the present invention, two or more species of the photo-polymerization initiator may be used in combination.

The radical photo-polymerization initiator used in the present invention is selectable typically from those commercially available. Those described for example in paragraph [0091] of JP-A-2008-105414 may preferably be used. Among them, acetophenone-based compound, acylphosphine oxide-based compound, and oxim ester-based compound are preferable from the viewpoints of curing sensitivity and absorption characteristics.

In the present invention, "light" includes not only those in the wavelength regions of UV, near-UV, deep-UV, visible light and infrared, and other electromagnetic waves, but also radiation ray. The radiation ray includes microwave, electron beam, EUV and X-ray. Also laser light such as 248 nm excimer laser, 193 nm excimer laser, and 172 nm excimer laser are usable. These sorts of light may be monochromatic light obtained after being passed through an optical filter, or may be composite light composed of a plurality of light components with different wavelengths.

Content of the photo-polymerization initiator used in the present invention is typically 0.01 to 15% by mass of the whole composition but excluding the solvent, preferably 0.1 to 12% by mass, and more preferably 0.2 to 7% by mass. When two or more species of photo-polymerization initiator are used, the total content falls in the above-described ranges.

If the content of the photo-polymerization initiator is 0.01% by mass or more, there will be preferable trends of improvement in sensitivity (fast curability), resolution, line edge roughness, and film strength. On the other hand, if the content of the photo-polymerization initiator is 15% by mass or less, there will be preferable trends of improvement in translucency, coloration and handleability.

Surfactant

The curable composition for imprints used in the present invention preferably contains a surfactant. The surfactant used in the present invention is exemplified by those used in the under layer film-forming composition as described above. Content of the surfactant used in the present invention is typically 0.001 to 5% by mass of the whole composition, preferably 0.002 to 4% by mass, and furthermore preferably 0.005 to 3% by mass. When two or more species of surfactant are used, the total content falls in the above-described ranges. If the content of the surfactant falls in the range from 0.001 to 5% by mass of the composition, an effect on uniformity of coating will be good, and degradation in mold transfer characteristics due to excessive surfactant will be less likely to occur.

The surfactant is preferably a nonionic surfactant, preferably contains at least one of fluorine-containing surfactant, Si-based surfactant and fluorine-containing/Si-based surfactant, more preferably contains both of the fluorine-containing surfactant and the Si-based surfactant, or, the fluorine-containing/Si-based surfactant, and most preferably contains the fluorine-containing/Si-based surfactant. Note that the fluorine-containing surfactant and the Si-based surfactant are preferably nonionic surfactants.

The "fluorine-containing/Si-based" means that the surfactant has features of both of fluorine-containing and Si-based surfactants.

By using this sort of surfactant, it is now able to solve problems regarding coating failure such as striation or scaly pattern (non-uniform drying of resist) which possibly occur when the curable composition for imprints is coated over a silicon wafer for manufacturing semiconductor device, glass square substrate for manufacturing liquid crystal display device, and substrates having formed thereon various films including chromium film, molybdenum film, molybdenum alloy film, tantalum film, tantalum alloy film, silicon nitride film, amorphous silicon film, tin oxide doped indium oxide (ITO) film, and tin oxide film. In particular, the under layer film-forming composition of the present invention added with the surfactant may largely be improved in the uniformity of coating, and may achieve appropriate coating characteristics in coating using a spin coater or slit scan coater, irrespective of the size of substrate.

Examples of the surfactant usable in the present invention may be referred to paragraph [0097] of JP-A-2008-105414, the content of which is incorporated by reference into this patent specification. The surfactant is also commercially available, typically under the trade name of PF-636 (from OMNOVA Solutions Inc.).

Non-Polymerizable Compound

The curable composition for imprints used in the present invention may contain a non-polymerizable compound which has, at the terminal thereof, at least one hydroxy group or a polyalkylene glycol structure formed by etherifying the hydroxy group, and contains substantially no fluorine atom and silicon atom.

Content of the non-polymerizable compound is preferably 0.1 to 20% by mass of the whole composition excluding the solvent, more preferably 0.2 to 10% by mass, still more preferably 0.5 to 5% by mass, and furthermore preferably 0.5 to 3% by mass.

Antioxidant

Preferably, the curable composition for imprints used in the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by BASF GmbH); Antigene P, 3C, FR, Sumilizer S, Sumilizer GA80 (by Sumitomo Chemical); Adekastab AO70, AO80, AO503 (by Adeka), etc. These may be used either singly or as combined.

Polymerization Inhibitor

Furthermore, the curable composition for imprints used in the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. The polymerization inhibitor may be added at the production of the polymerizable monomer or may be added the curable composition for imprints after the production of the polymerizable monomer.

Preferable examples of the polymerization inhibitor usable in the present invention may be referred to the description in paragraph [0125] of JP-A-2012-094821, the content of which is incorporated by reference into this patent specification.

Solvent

A solvent may be used for the curable composition for imprints used in the invention, in accordance with various needs. In particular, when a pattern having a thickness of at most 500 nm is formed, the composition preferably contains a solvent. Preferably, the solvent has a boiling point at normal pressure of from 80 to 200° C. Regarding the type of the solvent, any solvent capable of dissolving the composition may be used. Preferred are solvents having at least any one of an ester structure, a ketone structure, a hydroxyl group and an ether structure. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the composition for imprints used in the present invention may be suitably optimized depending on the viscosity of the constitutive ingredients except the solvent, the coatability of the composition and the intended thickness of the film to be formed. From the viewpoint of the coatability, the solvent content is preferably from 0 to 99% by mass of the composition. When the composition for imprints used in the present invention is applied onto the substrate by inkjet method, it is preferred that the composition does not substantially contain a solvent (for example 3% by mass or less, preferably 1% by mass or less). On the other hand, when a pattern having a film thickness of 500 nm or less is formed by spin-coating method or the like, the content may be 20 to 99% by mass, preferably 40 to 99% by mass, specifically preferably 70 to 98% by mass.

Polymer Ingredient

The curable composition for imprints used in the invention may contain a poly-functional oligomer having a larger molecular weight than that of the above-mentioned, other poly-functional monomer within a range capable of attaining the object of the invention, for the purpose of further increasing the crosslinking density of the composition. Examples of the photoradical-polymerizable poly-functional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The curable composition for imprints for imprints used in the present invention may further contain a polymer component, in view of improving the dry etching resistance, imprint suitability and curability. The polymer component preferably has a polymerizable functional group in the side chain thereof. Weight-average molecular weight of the polymer component is preferably 2,000 to 100,000, and more preferably 5,000 to 50,000, in view of compatibility with the polymerizable monomer. Amount of addition of the polymer component, with respect to portion of the composition excluding the solvent, is preferably 0 to 30% by mass, more preferably 0 to 20% by mass, and most preferably 2% by mass or less. Pattern formability may be improved by adjusting the content of polymer component having a molecular weight of 2,000 or larger, with respect to the portion of the curable composition for imprints of the present invention excluding the solvent. From the viewpoint of pattern formability, as least as possible amount of resin component is preferable, and therefore the curable composition preferably contains no polymer component other than those composing the surfactant or trace amounts of additives.

In addition to the above-mentioned ingredients, the curable composition for imprints used in the invention may contain, if desired, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

The curable composition for imprints of the present invention may be prepared by mixing the individual components described in the above. Mixing and dissolution are generally proceeded in the temperature range from 0 to 100° C.

The curable composition prepared by mixing the individual components is preferably filtered, typically through a filter with a pore size of 0.003 μm to 5.0 μm, and more preferably 0.01 to 1.0 μm. The filtration may be proceeded in a multi-stage manner, or may be repeated a large number of times. The filtrate may be re-filtered. Material for composing a filter used for filtration may be polyethylene resin, polypropylene resin, fluorine-containing resin, nylon resin or the like, but not specifically limited.

In the curable composition for imprints used in the present invention, a mixture of the total components excluding the solvent preferably has a viscosity of 100 mPa·s or smaller, more preferably 1 to 70 mPa·s, furthermore preferably 2 to 50 mPa·s, and most preferably 3 to 30 mPa·s.

The curable composition for imprints used in the present invention after manufacturing is bottled in containers such as gallon bottles or coated bottles, and transported or stored. In this case, the inner space of the containers may be replaced with an inert gas such as nitrogen or argon, for the purpose of preventing deterioration. While the curable composition for imprints may be transported or stored at normal temperature, it is also preferable to control the temperature in the range from −20° C. to 0° C. for the purpose of preventing denaturation. Of course, the curable composition for imprints may be shielded from light up to a level of suppressing the reaction from proceeding.

In permanent films (resists for structural members) for use in liquid-crystal displays (LCD) and in resists for use for substrate processing for electronic materials, the resist is preferably prevented from being contaminated as much as possible with metallic or organic ionic impurities in order that the resist does not interfere with the performance of the products. Accordingly, the concentration of the metallic or organic ionic impurities in the curable composition for imprints of the invention is preferably at most 1 ppm, more preferably at most 100 ppb, even more preferably at most 10 ppb.

<Method of Film Making>

The under layer film-forming composition of the present invention is applied onto a substrate to form the under layer film. Methods of application onto the substrate include dip coating, air knife coating, curtain coating, wire bar coating, gravure coating, extrusion coating, spin coating, slit scan coating, and ink jet coating, by which a coated film or droplets may be formed on the substrate. Coating is preferable from the viewpoint of uniformity of film thickness, and spin coating is more preferable. The solvent is dried off thereafter. The drying temperature is preferably 70° C. to 130° C. The drying is preferably followed by curing through activation energy (preferably heat and/or light). Curing under heating at 150° C. to 250° C. is preferable. The process of drying off the solvent and the process of curing may be proceeded at the same time. As described above, in the present invention, it is preferable to apply the under layer film-forming composition, followed by curing of a part of the under layer film-forming composition through heat or photo-irradiation, and further followed by application of the composition for imprints. By employing the technique, also the under layer film-forming composition is thoroughly cured in the process of photo-curing of the curable composition for imprints, and thereby the adhesiveness will be more likely to improve.

<Substrate>

Substrate (wafer or support) on which the under layer film-forming composition of the present invention is coated is selectable, depending on a variety of applications, typically from quartz, glass, optical film, ceramic material, evaporated film, magnetic film, reflective film, metal substrate composed of Ni, Cu, Cr or Fe, paper, SOC (Spin On Carbon), SOG (Spin On Glass), polymer substrates composed of polyester film, polycarbonate film or polyimide film, TFT array substrate, electrode substrate of PDP, glass or translucent plastic substrate, electro-conductive substrate composed of ITO or metal, and substrates used in semiconductor process such as insulating substrate, silicon, silicon nitride, polysilicon, silicon oxide or amorphous silicon, without special limitation. In the present invention, an appropriate under layer film may be formed particularly when a substrate having a small surface energy (for example, 40 to 60 mJ/m$^2$ or around) is used. Nevertheless, when the substrate is intended to be etched, a substrate used for semiconductor process is preferably used as described later.

A patterned laminate composed of the substrate, the under layer film and the curable composition for imprints of the present invention may be used as an etching resist. The substrate in this case is exemplified by those (silicon wafer) having formed thereon a film of SOC (Spin On Carbon), SOG (Spin On Glass), SiO$_2$ or silicon nitride.

Multiple etching onto a substrate may be carried out at the same time. A laminate composed of the substrate, the under layer film and the curable composition for imprints of the present invention is less causative of film separation, and is therefore useful, even under environmental changes or stress applied thereto, when used as a permanent film in devices or structures, in an intact form, or in a form obtained after removing any residual film in recessed portions or removing the under layer film.

In the present invention, in particular, a substrate having a polar group on the surface thereof is preferably used. By using the substrate having a polar group on the surface thereof, the adhesiveness with the under layer film-forming composition tends to improve more effectively. The polar group is exemplified by hydroxy group, carboxy group, and silanol group. Silicon substrate and quartz substrate are particularly preferable.

Geometry of the substrate is not specifically limited, and may be in a sheet form or rolled form. The substrate is also selectable from those of translucent and non-translucent types, depending on combination with the mold, as described later.

<Process>

The method of forming a pattern according to the present invention includes applying the under layer film-forming composition for imprints of the present invention onto the substrate to thereby form the under layer film; and applying the curable composition for imprints onto the under layer film. The method further preferably includes, after applying the under layer film-forming composition for imprints of the present invention onto the substrate, allowing a part of the under layer film-forming composition for imprints to cure through heat or photo-irradiation, and applying thereon the curable composition for imprints.

The under layer film-forming composition of the present invention is preferably 1 to 10 nm thick as applied (for example, thickness of coated film), and more preferably 2 to 7 nm thick. The thickness of the film after cured is preferably 1 to 10 nm, and more preferably 2 to 7 nm.

FIG. 1 is a schematic drawing illustrating an exemplary manufacturing process when the curable composition for imprints is used for working of a substrate by etching, wherein reference numeral 1 stands for the substrate, 2 stands for the under layer film, 3 stands for the curable composition for imprints, and 4 stands for the mold. In FIG. 1, the under layer film-forming composition 2 is applied onto the surface of the substrate 1 (2), the curable composition for imprints 3 is applied onto the surface (3), and the mold is applied onto the surface thereof (4). After the photo-irradiation, the mold is separated (5). The laminate is etched according to a pattern formed by the curable composition for imprints (6), the curable composition for imprints 3 and the under layer film-forming composition 2 are separated, to thereby form the substrate with a desired pattern formed thereon (7). The adhesiveness between the substrate 1 and the curable composition for imprints 3 is important, since a poor level of the adhesiveness will fail in exactly transferring the pattern of the mold 4.

More specifically, the method of forming a pattern according to the present invention includes applying the under layer film-forming composition for imprints of the present invention onto the substrate to thereby form the under layer film; and applying the curable composition for imprints onto the under layer film. The method further preferably includes, after applying the under layer film-forming composition for imprints of the present invention onto the substrate, allowing a part of the under layer film-forming composition for imprints to cure through heat or photo-irradiation, and applying thereon the curable composition for imprints. In general, the method includes irradiating light onto the curable composition for imprints and the under layer, while holding them between the substrate and a mold with fine patterns to thereby cure the curable composition for imprints, and separating the mold. Details of the method will be described below.

Methods of applying the under layer film-forming composition and the curable composition for imprints of the present invention are respectively selectable from those publicly well known.

The methods of application in the present invention are exemplified by dip coating, air knife coating, curtain coating, wire bar coating, gravure coating, extrusion coating, spin coating, slit scan coating, or ink jet coating, by which a coated film or droplets may be formed on the substrate or on the under layer film. Thickness of the pattern forming layer composed of the curable composition for imprints of the present invention is 0.03 μm to 30 μm or around, which may vary depending on purpose of use. The curable composition for imprints may be coated by multiple coating. In the method of placing droplets on the under layer film typically by ink jet coating, volume of each droplet is preferably 1 pl to 20 pl. The droplets are preferably arranged on the under layer film while keeping a space in between.

Next, in the patterning method of the invention, a mold is pressed against the surface of the patterning layer for transferring the pattern from the mold onto the patterning layer. Accordingly, the micropattern previously formed on the pressing surface of the mold is transferred onto the patterning layer.

Alternatively, the composition for imprints may be coated over the mold having a pattern formed thereon, and the under layer film may be pressed thereto.

The mold material usable in the invention is described. In the photoimprint lithography with the composition for imprints of the invention, a light-transmissive material is selected for at least one of the mold material and/or the substrate. In the photoimprint lithography applied to the invention, the curable composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for photoimprints is applied onto a light-transmissive substrate, then a mold is pressed against it, and this is irradiated with light from the back of the substrate whereby the curable composition for photoimprints can be cured.

The photoirradiation may be attained while the mold is kept in contact with the layer or after the mold is released. In the invention, preferably, the photoirradiation is attained while the mold is kept in contact with the patterning layer.

The mold usable in the present invention has a pattern to be transferred. The pattern on the mold may be formed with a desired level of processing accuracy, typically by photolithography, electron beam lithography and so forth. Methods of forming the pattern on the mold is not specifically limited in the present invention. Also a pattern formed by the method of forming a pattern according to the present invention may be used as a mold.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold for use in the patterning method of the invention may be processed for surface release treatment for the purpose of enhancing the releasability of the curable composition for imprints from the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred.

In photoimprint lithography with the curable composition for imprints, in general, the mold pressure in the patterning method of the invention is preferably at most 10 atmospheres. When the mold pressure is at most 10 atmospheres, then the mold and the substrate are hardly deformed and the patterning accuracy tends to increase. It is also favorable since the pressure unit may be small-sized since the pressure to be given to the mold may be low. The mold pressure is preferably selected from the region capable of securing the mold transfer uniformity, within a range within which the residual film of the curable composition for imprints in the area of mold pattern projections may be reduced.

In the patterning method of the invention, the dose of photoirradiation in the step of irradiating the patterning layer with light may be sufficiently larger than the dose necessary for curing. The dose necessary for curing may be suitably determined depending on the degree of consumption of the unsaturated bonds in the curable composition for imprints and on the tackiness of the cured film as previously determined.

In the imprint lithography applied to the present invention, photo-irradiation is conducted while keeping the substrate temperature generally at room temperature, wherein the photo-irradiation may alternatively be conducted under heating for the purpose of enhancing the reactivity. Also photo-irradiation in vacuo is preferable, since a vacuum conditioning prior to the photo-irradiation is effective for preventing entrainment of bubbles, suppressing the reactivity from being reduced due to incorporation of oxygen, and for improving the adhesiveness between the mold and the curable composition for imprints. In the method of forming a pattern according to the present invention, the degree of vacuum in the process of photo-irradiation is preferably in the range from $10^{-1}$ Pa to normal pressure.

Light to be used for photoirradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer (a layer comprising the curable composition for imprints layer) is cured through photoirradiation, if desired, the cured pattern may be further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

EXAMPLES

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

<Synthesis of Resin U-1>

In a flask, 100 g of propylene glycol monomethyl ether acetate (PGMEA) is placed as a solvent, and the content was heated to 90° C. under a nitrogen atmosphere. Into the solution, a mixed solvent, composed of 16.0 g (0.16 mol) of methyl methacrylate (MMA) (from Wako Pure Chemical Industries Ltd.), 20.7 g (0.24 mol) of methacrylic acid (MAA) (from Wako Pure Chemical Industries Ltd.), 2.8 g (12 mmol) of 2,2'-azobis(methyl 2-methylpropanate) (V-601) (from Wako Pure Chemical Industries Ltd.), and 50 g of PGMEA, was dropped over 2 hours. After completion of the dropping, the mixture was further stirred at 90° C. for 4 hours, to thereby obtain an MMA/MAA copolymer.

Into the MMA/MAA copolymer solution, added were 25.6 g (0.12 mol) of glycidyl methacrylate (GMA) (from Wako Pure Chemical Industries Ltd.), 2.1 g of tetraethylammonium bromide (TEAB) (from Wako Pure Chemical Industries Ltd.), and 50 mg of 4-hydroxy-tetramethylpiperidine-1-oxyl (4-HO-TEMPO) (from Wako Pure Chemical Industries Ltd.), and the mixture was allowed to react at 90° C. for 8 hours. By confirming by $^1$H-NMR that GMA was exhausted out by the reaction, a PGMEA solution of resin U-1 was obtained. The weight average molecular weight (Mw, in polystyrene equivalent) of the thus-obtained U-1, determined by gel permeation chromatography (GPC), was found to be 14,000, with a degree of dispersion (Mw/Mn) of 2.2.

<Synthesis of Resin U-2>

Resin U-2 was synthesized similarly to resin U-1, except that the amount of use of GMA was increased to 31.3 g.

<Synthesis of Resin U-3>

In a flask, 100 g of PGMEA was placed as a solvent, and the content was heated to 90° C. under a nitrogen atmosphere. Into the solution, a mixed solvent, composed of 16.0 g (0.16 mol) of MMA, 34.1 g (0.24 mol) of GMA, 2.8 g (12 mmol) of V-601, and 50 g of PGMEA, was dropped over 2 hours. After completion of the dropping, the mixture was further stirred at 90° C. for 4 hours, to thereby obtain an MMA/GMA copolymer.

In the container containing the MMA/GMA copolymer, placed were 19.0 g (0.26 mol), which amounts 1.1 equivalents of GMA, of acrylic acid (AA) (from Wako Pure Chemical Industries Ltd.), 2.1 g of TBAB, and 50 mg of 4-HO-TEMPO, and the mixture was allowed to react at 90° C. for 8 hours. By confirming by $^1$H-NMR that the glycidyl group was exhausted out by the reaction, a PGMEA solution of resin U-3 was obtained. The thus-obtained U-3 was found to have a Mw of 16,000, with a degree of dispersion (Mw/Mn) of 2.1.

<Synthesis of Resin U-11>

In a flask, 100 g of PGMEA was placed as a solvent, and the content was heated to 90° C. under a nitrogen atmosphere. Into the solution, a mixed liquid composed of 16.0 g (0.16 mol) of MMA, 31.2 g (0.24 mol) of hydroxyethyl methacrylate (HEMA) (from Wako Pure Chemical Industries Ltd.), 2.8 g (12 mmol) of V-601, and 50 g of PGMEA was dropped over 2 hours. After completion of the dropping, the mixture was further stirred at 90° C. for 4 hours, to thereby obtain an MMA/HEMA copolymer.

In the container containing the MMA/HEMA copolymer, placed were 18.7 g (0.12 mol) of 2-methacryloyloxyethyl isocyanate (MOI) (from Showa Denko K.K.), and 0.04 g of dibutyl tin dilaurate, and the mixture was allowed to react at 60° C. for 6 hours to thereby obtain a PGMEA solution of resin U-11. The thus-obtained U-11 was found to have a Mw of 18,000, with a degree of dispersion (Mw/Mn) of 2.2.

<Synthesis of Other Resins>

According to the exemplary synthesis of the above-described resins, also other resins listed in Table below were synthesized. In the Table below, BzMA represents benzyl methacrylate (from Wako Pure Chemical Industries Ltd.). THFMA represents tetrahydrofurfuryl methacrylate (from Wako Pure Chemical Industries Ltd.). DMAEMA represents 2-(N,N-dimethylamino)ethyl methacrylate (from Wako Pure Chemical Industries Ltd.). GBLMA represents α-methacryloxy-γ-butyrolactone (from Tosoh Corporation). BMGBL represents β-methacryloxy-γ-butyrolactone (from Tosoh Corporation). MNBL represents 5-oxo-4-oxatricyclo [4.2.1.0$^{3,7}$]nonane-2-yl methacrylate (from Daicel Corporation). PCMA represents (2-oxo-1,3-dioxolane-4-yl)methyl-methacrylate, and was synthesized from 4-(hydroxymethyl)-1,3-dioxolane-2-one (from Tokyo Chemical Industry Co. Ltd.).

Molar ratios of the source monomers, weight average molecular weight (Mw), and acid value of the resins used in this embodiment are listed in Table below. The acid value is given in mmol/g. Notation of MAA-GMA means that MAA is a constituent of the principal chain, to which groups derived from GMA are bound as side chains. The same will apply also to GMA-AA and so forth.

The acid value was measured by potentiometric titration. More specifically, each resin was dissolved into a 9:1 mixed solvent of propylene glycol monomethyl ether and water, the solution was titrated with a 0.1 mol/L aqueous potassium hydroxide solution, and the acid value (mmol/g) was calculated based on a titer consumed up to an inflection point on a titration curve.

TABLE 1

|  | MMA | MAA | MA-GMA | GMA-AA | Mw | Acid value |
|---|---|---|---|---|---|---|
| U-1 | 40 | 15 | 45 |  | 14000 | 0.96 |
| U-2 | 40 | 5 | 55 |  | 15000 | 0.29 |
| U-3 | 40 |  |  | 60 | 16000 | <0.05 |
| U-4 | 15 |  |  | 85 | 17000 | <0.05 |
| U-5 | 5 |  |  | 95 | 17000 | <0.05 |
| U-6 |  |  |  | 100 | 17000 | <0.05 |

TABLE 2

|  | BzMA | HEMA | GMA-AA | Mw | Acid value |
|---|---|---|---|---|---|
| U-7 | 15 |  | 85 | 16000 | <0.05 |
| U-8 | 5 |  | 95 | 16000 | <0.05 |
| U-9 |  | 15 | 85 | 18000 | <0.05 |
| U-10 |  | 5 | 95 | 18000 | <0.05 |

TABLE 3

|  | MMA | BzMA | HEMA | HEMA-MOI | Mw | Acid value |
|---|---|---|---|---|---|---|
| U-11 | 40 |  | 30 | 30 | 18000 | <0.05 |
| U-12 | 40 |  | 15 | 45 | 19000 | <0.05 |
| U-13 | 40 |  |  | 60 | 20000 | <0.05 |
| U-14 |  | 40 | 15 | 45 | 18000 | <0.05 |

TABLE 4

|  | THFMA | DMAEMA | GMA-AA | Mw | Acid value |
|---|---|---|---|---|---|
| U-15 | 50 |  | 50 | 15000 | <0.05 |
| U-16 | 25 |  | 75 | 16000 | <0.05 |
| U-17 | 5 |  | 95 | 17000 | <0.05 |
| U-18 |  | 50 | 50 | 15000 | <0.05 |
| U-19 |  | 25 | 75 | 16000 | <0.05 |
| U-20 |  | 5 | 95 | 17000 | <0.05 |

TABLE 5

|  | GBLMA | MAA | MA-GMA | GMA-AA | Mw | Acid value |
|---|---|---|---|---|---|---|
| U-21 | 40 | 30 | 30 |  | 14000 | 2.21 |
| U-22 | 40 | 15 | 45 |  | 15000 | 0.95 |
| U-23 | 50 |  |  | 50 | 15000 | <0.05 |
| U-24 | 25 |  |  | 75 | 16000 | <0.05 |
| U-25 | 10 |  |  | 90 | 17000 | <0.05 |

TABLE 6

|  | BMGBL | MNBL | PCMA | GMA-AA | Mw | Acid value |
|---|---|---|---|---|---|---|
| U-26 | 25 |  |  | 75 | 16000 | <0.05 |
| U-27 |  | 25 |  | 75 | 17000 | <0.05 |
| U-28 |  |  | 25 | 75 | 16000 | <0.05 |

Structures of the resins used in the present invention are listed below. x, y and z stand for molar ratios of the individual repeating units, and may be calculated referring to Tables above.

TABLE 7

| Resin (A) |
|---|

U-1, U-2: methyl acrylate / acrylic acid / glycerol monomethacrylate ester copolymer (x/y/z)

U-3, U-4, U-5: methyl acrylate / glycerol monoacrylate ester copolymer (x/z)

U-6: glycerol monoacrylate ester homopolymer (z)

U-7, U-8: benzyl acrylate / glycerol monoacrylate ester copolymer (x/z)

U-9, U-10: 2-hydroxyethyl acrylate / glycerol monoacrylate ester copolymer (x/z)

U-11, U-12: methyl acrylate / 2-hydroxyethyl acrylate / carbamate-linked methacrylate copolymer (x/y/z)

U-13: methyl acrylate / carbamate-linked methacrylate copolymer (x/z)

TABLE 7-continued

Resin (A)

U-14, U-15, U-16, U-17, U-18, U-19, U-20 — structures shown.

TABLE 8

Resin (A2)

U-21, U-22, U-23, U-24, U-25 — structures shown.

TABLE 8-continued

Resin (A2)

U-26, U-27, U-28: [chemical structures]

TABLE 9

| Comparative resin | Mw | Acid value |
|---|---|---|
| R-1 [chemical structure] average m + n = 11, average n/(m + n) = 0.5, NK Oligo EA-7440, from Shin-Nakamura Chemical Industry Co. Ltd. | 4000 | 1.53 |

TABLE 9-continued

| Comparative resin | | Mw | Acid value |
|---|---|---|---|
| R-2 | 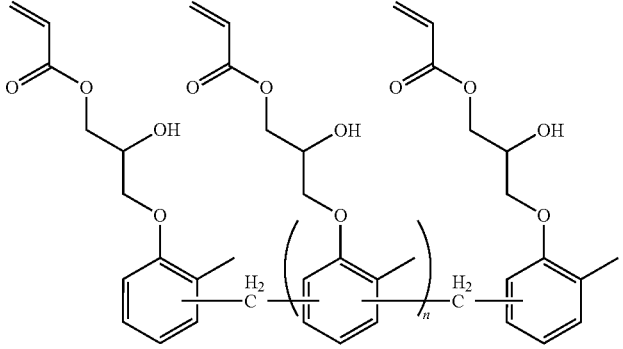<br>average n = 11,<br>NK Oligo EA-7420, from Shin-Nakamura Chemical Industry Co. Ltd. | 3500 | <0.05 |
| R-3 | 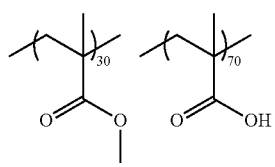<br>MMA/MAA copolymer | Mw = 12,000, degree of dispersion = 2.1 | 6.54 |
| R-4 | 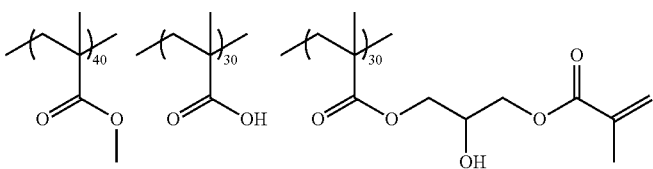<br>Synthesized similarly to U-1. | Mw = 13,000, degree of dispersion = 2.1 | 2.23 |
| R-5 | 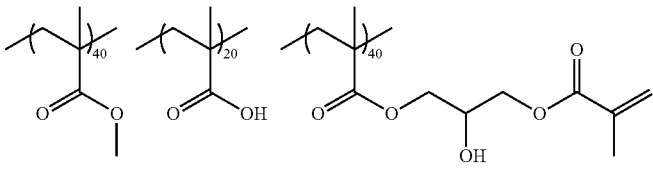<br>Synthesized similarly to U-1. | Mw = 14,000, degree of dispersion = 2.1 | 1.35 |
| R-6 | 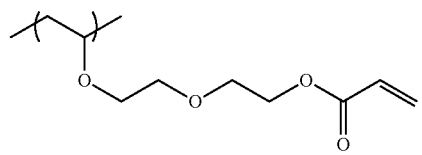<br>PVEEA, from Nippon Shokubai Co. Ltd. | Mw = 21,000, degree of dispersion = 2.2 | <0.05 |

<Formation of Under Layer Film>

Each of the resins listed above was diluted with PGMEA so as to adjust the solid content to 0.1% by mass. The solution was filtered through a 0.1 μm PTFE filter to thereby obtain an under layer film-forming composition.

On an SOG (Spin On Glass) film (surface energy=55 mJ/m$^2$) formed over a wafer, the under layer film-forming composition was spin-coated, heated on a hot plate at 100° C. for 1 minute, to thereby dry up the solvent. The coating was further heated on a hot plate at 220° C. for 5 minutes, so as to allow the under layer film-forming composition to cure, to thereby form the under layer film. Thickness of the under layer film after cured was found to be 5 nm thick.

<Evaluation of Surface Roughness of Under Layer Film>

Each under layer film obtained above was scanned over a 10-μm square area under an atomic force microscope (AFM) (Dimension Icon, from Bruker AXS, Inc.), and arithmetic average surface roughness (Ra) was measured. Results are summarized in Table below.

A: Ra<0.4 nm
B: 0.4 nm≤Ra<1.0 nm
C: 1.0 nm≤Ra

<Preparation of Curable Composition for Imprints>

The polymerizable compounds, photo-polymerization initiators and additives listed in Table below were respectively mixed, and 4-hydroxy-2,2,6,6-tetramethylpiperidine-1-oxyl, free radical (Tokyo Chemical Industry Co. Ltd.) was added as a polymerization inhibitor so as to adjust the content thereof to 200 ppm (0.02% by mass) of the monomer. The individual mixtures were filtered through a 0.1 μm PTFE filter, to thereby prepare curable compositions for imprint V-1 and V-2. Numerals in Table are given in ratio by weight.

TABLE 10

| | Availability | V-1 | V-2 |
|---|---|---|---|
| M-1 | Biscoat #192 (from Osaka Chemical Industry Co. Ltd.) | 48 | |
| M-2 | Synthesized from 2-bromomethylnaphthalene and acrylic acid | | 48 |
| M-3 | Synthesized from α,α'-dichloro-m-xylene and acrylic acid | 48 | 48 |
| M-4 | R-1620 (from Daikin Industries Ltd.) | 2 | |
| PI-1 | Irgacure 907 (from BASF) | 2 | 2 |
| S-1 | PF-636 (from OMNOVA Solutions Inc.) | | 2 |

[Chemical Formula 15]

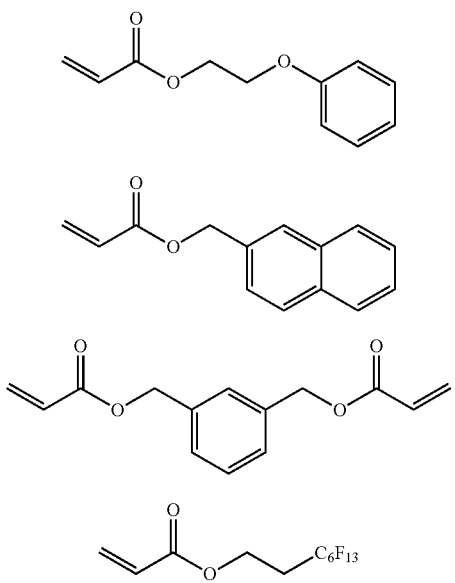

<Evaluation of Separation Defect>

On the surface of each of the thus-obtained under layer films, each of the curable compositions for imprint V-1 or V-2, conditioned at 25° C., was ejected using an ink jet printer DMP-2831 from Fujifilm Dimatix, Inc., with a volume of droplet of 1 pl per nozzle, so as to align droplets according to an approximately 100 μm-pitch square grid pattern, to thereby form a pattern forming layer. Next, a quartz mold (rectangular line/space pattern (1/1), line width=60 nm, groove width=100 nm, line edge roughness=3.5 nm) was pressed against the pattern forming layer, so as to fill the pattern forming layer (curable composition for imprints) into the mold. The pattern forming layer was then irradiated with light through the mold using a high pressure mercury lamp with an energy of 300 mJ/cm², and the mold was separated, to thereby transfer the pattern onto the pattern forming layer.

The pattern transferred onto the pattern forming layer was observed under an optical microscope (STM6-LM, from Olympus Corporation), and separation defect in the pattern forming layer was evaluated.

A: no separation defect found over the entire pattern area;

B: separation defect found in less than 5% of the entire pattern area;

C: separation defect found in 5% or more and less than 50% of the entire pattern area; and D: separation defect found in 50% or more of the entire pattern area.

<Evaluation of Adhesiveness>

Each of the under layer film-forming compositions described above was coated by spin coating over the SOG film formed on a silicon wafer, or on a quartz wafer, and heated on a hot plate at 100° C. for 1 minute to thereby dry up the solvent. The under layer film-forming composition was further heated on a hot plate at 220° C. for 5 minutes so as to cure, to thereby form the under layer film. The cured under layer film was found to be 3 nm thick.

On the surface of each of the thus-obtained under layer films, the curable composition for imprints V-1 or V-2, conditioned at 25° C., was ejected using an ink jet printer DMP-2831 from Fujifilm Dimatix, Inc., with a volume of droplet of 1 pl per nozzle, so as to align droplets according to an approximately 100 μm-pitch square grid pattern, to thereby form a pattern forming layer. Next, a quartz wafer was placed from the top so as to oppose the under layer film with the pattern forming layer (layer of the curable composition for imprints), and the pattern forming layer was then irradiated with light through the quartz wafer using a high pressure mercury lamp with an energy of 300 mJ/cm². After the irradiation, the quartz wafer was separated, wherein the force of mold separation was measured.

The force of mold separation corresponds to the adhesiveness F (in N) between the silicon wafer and the curable composition for imprints. The force of mold separation was measured according to a method described in paragraphs [0102] to [0107] of JP-A-2011-206977. More specifically, the measurement was conducted according to separation steps 1 to 6 and 16 to 18 illustrated in FIG. 5 of this publication.

TABLE 11

| | Resin (A) | Curable composition | Surface roughness of under layer film | Separation defect | Adhesiveness |
|---|---|---|---|---|---|
| Example 1 | U-1 | V-1 | B | B | B |
| Example 2 | U-2 | V-1 | A | B | B |
| Example 3 | U-3 | V-1 | A | A | B |
| Example 4 | U-4 | V-1 | A | A | A |
| Example 5 | U-5 | V-1 | A | A | A |
| Example 6 | U-6 | V-1 | A | A | A |
| Example 7 | U-7 | V-1 | A | A | A |
| Example 8 | U-8 | V-1 | A | A | A |
| Example 9 | U-9 | V-1 | A | A | A |
| Example 10 | U-10 | V-1 | A | A | A |
| Example 11 | U-11 | V-1 | B | A | A |
| Example 12 | U-12 | V-1 | B | A | A |
| Example 13 | U-13 | V-1 | B | B | B |
| Example 14 | U-14 | V-1 | B | A | A |
| Example 15 | U-4 | V-2 | A | A | A |
| Example 16 | U-15 | V-1 | A | B | B |
| Example 17 | U-16 | V-1 | A | A | A |
| Example 18 | U-17 | V-1 | A | A | A |
| Example 19 | U-18 | V-1 | A | B | B |
| Example 20 | U-19 | V-1 | A | A | A |
| Example 21 | U-20 | V-1 | A | A | A |
| Example 22 | U-22 | V-1 | B | A | A |

TABLE 11-continued

| | Resin (A) | Curable composition | Surface roughness of under layer film | Separation defect | Adhesiveness |
|---|---|---|---|---|---|
| Example 23 | U-23 | V-1 | A | A | A |
| Example 24 | U-24 | V-1 | A | A | S |
| Example 25 | U-25 | V-1 | A | A | A |
| Example 26 | U-26 | V-1 | A | A | S |
| Example 27 | U-27 | V-1 | A | B | B |
| Example 28 | U-28 | V-1 | A | A | S |
| Comparative example 1 | R-1 | V-1 | C | B | A |
| Comparative example 2 | R-2 | V-1 | B | C | C |
| Comparative example 3 | R-3 | V-1 | C | D | D |
| Comparative example 4 | R-4 | V-1 | C | C | B |
| Comparative example 5 | R-5 | V-1 | C | C | B |
| Comparative example 6 | R-6 | V-1 | C | C | D |
| Comparative example 7 | U-21 | V-1 | C | B | A |

S: F ≥ 45
A: 45 > F ≥ 40
B: 40 > F ≥ 30
C: 30 > F ≥ 20
D: 20 > F

It was found from Table above that, by using the under layer film-forming composition of the present invention, it became possible to provide the under layer film excellent in the surface roughness and high in the adhesiveness, and to improve the pattern formability by imprint. In contrast, the various characteristics were found to degrade when the under layer film-forming compositions of Comparative Examples were used.

Equivalent results were obtained when, in the individual Examples, the light source used for curing the curable compositions was changed from the high pressure mercury lamp to an LED, metal halide lamp, or excimer lamp.

Also similar trends were confirmed when, in the individual Examples, the substrate used for measuring the adhesiveness was changed from the silicon wafer coated with spin-on-glass (SOG) to a silicon wafer or quartz wafer.

The present disclosure relates to the subject matter contained in Japanese Patent Application 136896/2012, filed on Jun. 18, 2012, and Japanese Patent Application No. 063881/2013 filed on Mar. 26, 2013, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method of forming a pattern comprising:
applying an under layer film-forming composition for imprints onto a surface of a substrate to thereby form a under layer film; and
applying a curable composition for imprints onto a surface of the under layer film,
said method further comprising, after applying the under layer film-forming composition for imprints onto the surface of the substrate, allowing a part of the under layer film-forming composition for imprints to cure through heat or photo-irradiation, and applying onto the surface thereof the curable composition for imprints,
and still further comprising irradiating light onto the curable composition for imprints and the under layer, while holding them between the substrate and a mold with fine patterns, to thereby cure the curable composition for imprints, and separating the mold,
wherein the under layer film-forming composition for imprints comprises a (meth)acrylic resin (A) and a solvent (B),
wherein the (meth)acrylic resin (A) contains an ethylenic unsaturated group (P) and a nonionic hydrophilic group (Q), has a weight average molecular weight of 1,000 or larger and an acid value of smaller than 1.0 mmol/g, and contains a repeating unit represented by the formula (I) below:

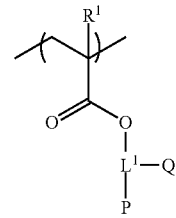

Formula (I)

wherein $R^1$ represents a hydrogen atom, a methyl group or a hydroxymethyl group, $L^1$ represents a trivalent linking group, P represents an ethylenic unsaturated group, and Q represents a nonionic hydrophilic group which is an alcoholic hydroxy group.

2. A method of manufacturing a semiconductor device comprising the method of forming a pattern described in claim 1.

3. The method of forming a pattern of claim 1, wherein the resin (A) further contains a repeating unit represented by the formula (II) below

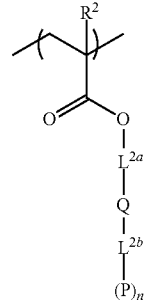

Formula (II)

wherein $R^2$ represents a hydrogen atom, a methyl group or a hydroxymethyl group, $L^{2a}$ represents a single bond or divalent linking group, $L^{2b}$ represents a single bond, divalent linking group or trivalent linking group, P represents an ethylenic unsaturated group, Q represents a nonionic hydrophilic group, and n represents 1 or 2.

4. The method of forming a pattern of claim 1, wherein the resin (A) further contains a repeating unit represented by the formula (III) below and/or a repeating unit represented by the formula (IV) below:

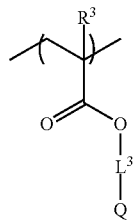

Formula (III)

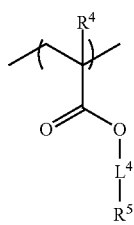

Formula (IV)

wherein each of $R^3$ and $R^4$ independently represents a hydrogen atom, a methyl group or a hydroxymethyl group, each of $L^3$ and $L^4$ independently represents a single bond or divalent linking group, Q represents a nonionic hydrophilic group, and $R^5$ represents a $C_{1-12}$ aliphatic group, a $C_{3-12}$ alicyclic group or a $C_{6-12}$ aromatic group.

5. The method of forming a pattern of claim 4, wherein the resin (A) further contains a repeating unit represented by the formula (II) below

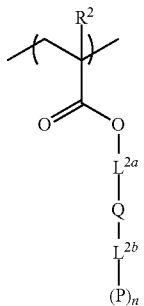

Formula (II)

wherein $R^2$ represents a hydrogen atom, a methyl group or a hydroxymethyl group, $L^{2a}$ represents a single bond or divalent linking group, $L^{2b}$ represents a single bond, divalent linking group or trivalent linking group, P represents an ethylenic unsaturated group, Q represents a nonionic hydrophilic group, and n represents 1 or 2.

6. The method of forming a pattern of claim 4, wherein the ethylenic unsaturated group (P) is a (meth)acryloyloxy group.

7. The method of forming a pattern of claim 4, wherein the nonionic hydrophilic group (Q) in Formula (III) represents an alcoholic hydroxy group or urethane group.

8. The method of forming a pattern of claim 1, wherein the ethylenic unsaturated group (P) is a (meth)acryloyloxy group.

9. The method of forming a pattern of claim 1, wherein the (meth)acrylic resin (A) is a copolymer containing 20 mol % or more of a repeating unit having an ethylenic unsaturated group (P), and 40 mol % or more of a repeating unit having a nonionic hydrophilic group.

10. The method of forming a pattern of claim 1, wherein the (meth)acrylic resin (A) has an acid value of smaller than 0.3 mmol/g.

11. The method of forming a pattern of claim 1, wherein the solvent (B) contains at least one solvent selected from the group consisting of propylene glycol monomethyl ether acetate (PGMEA), ethoxyethyl propionate, cyclohexanone, 2-heptanone, γ-butyrolactone, butyl acetate, propylene glycol monomethyl ether, and ethyl lactate.

* * * * *